United States Patent
Ono et al.

(10) Patent No.: US 12,374,574 B2
(45) Date of Patent: Jul. 29, 2025

(54) ELECTROSTATIC CHUCK

(71) Applicant: TOTO LTD., Kitakyushu (JP)

(72) Inventors: Akihito Ono, Kitakyushu (JP); Jumpei Uefuji, Kitakyushu (JP); Tatsuya Hayakawa, Kitakyushu (JP)

(73) Assignee: Toto Ltd., Fukuoka (JP)

( * ) Notice: Subject to any disclaimer, the term of this patent is extended or adjusted under 35 U.S.C. 154(b) by 276 days.

(21) Appl. No.: 18/118,879

(22) Filed: Mar. 8, 2023

(65) Prior Publication Data
US 2023/0317493 A1  Oct. 5, 2023

(30) Foreign Application Priority Data

Mar. 29, 2022  (JP) .................................. 2022-053874

(51) Int. Cl.
 *H01L 21/683*  (2006.01)
 *H05B 3/28*  (2006.01)

(52) U.S. Cl.
CPC ......... *H01L 21/6833* (2013.01); *H05B 3/283* (2013.01); *H05B 2203/005* (2013.01); *H05B 2203/016* (2013.01)

(58) Field of Classification Search
CPC .......... H01L 21/6833; H05B 2203/003; H05B 2203/005; H05B 2203/01; H05B 2203/013; H05B 2203/016; H05B 3/283
See application file for complete search history.

(56) References Cited

U.S. PATENT DOCUMENTS

| | | | |
|---|---|---|---|
| 2002/0170676 A1 | 11/2002 | Mitrovic et al. | |
| 2013/0292057 A1 | 11/2013 | Ramaswamy et al. | |
| 2014/0231019 A1 | 8/2014 | Kajihara | |
| 2016/0307787 A1 | 10/2016 | Uemura et al. | |
| 2018/0286732 A1* | 10/2018 | Uefuji | H01L 21/6831 |
| 2019/0019715 A1 | 1/2019 | Uefuji et al. | |
| 2022/0102183 A1* | 3/2022 | Ono | H01L 21/67248 |

FOREIGN PATENT DOCUMENTS

| | | | | |
|---|---|---|---|---|
| CN | 116895592 A | * | 10/2023 | ........ H01J 37/32724 |
| EP | 1 804 274 A2 | | 7/2007 | |
| JP | 2009-044075 A | | 2/2009 | |
| JP | 5165825 B2 | | 3/2013 | |
| JP | 2014-529826 A | | 11/2014 | |

(Continued)

*Primary Examiner* — Jared Fureman
*Assistant Examiner* — Daniel R Schwarck
(74) *Attorney, Agent, or Firm* — Carrier, Shende & Associates P.C.; Joseph P. Carrier; Fulchand P. Shende

(57) ABSTRACT

An electrostatic chuck includes a ceramic dielectric substrate, a base plate, and a heater unit. The heater unit includes a first power feeding portion, a second power feeding portion, and a heater line. The heater line includes a plurality of extension portions arranged in a second direction. The plurality of extension portions includes a first extension portion and a second extension portion. A third distance between the first extension portion and a first virtual tangent and a fourth distance between the second extension portion and a second virtual tangent each are not more than a first distance between the first power feeding portion and the second power feeding portion. The third distance and the fourth distance each are not more than a second distance between the plurality of extension portions.

5 Claims, 18 Drawing Sheets

(56) References Cited

FOREIGN PATENT DOCUMENTS

| | | |
|---|---|---|
| JP | 2016-207777 A | 12/2016 |
| JP | 2017-168818 A | 9/2017 |
| JP | 2018-120910 A | 8/2018 |
| JP | 2018-142488 A | 9/2018 |
| JP | 2018-170508 A | 11/2018 |
| JP | 2019-149434 A | 9/2019 |
| KR | 2014-0065016 A | 5/2014 |
| WO | 2013/033332 A1 | 3/2013 |

\* cited by examiner

ELECTROSTATIC CHUCK

CROSS-REFERENCE TO RELATED APPLICATIONS

This application is based upon and claims the benefit of priority from Japanese Patent Application No. 2022-053874, filed on Mar. 29, 2022; the entire contents of which are incorporated herein by reference.

FIELD

Embodiments described herein relate generally to an electrostatic chuck.

BACKGROUND

In a plasma processing chamber where etching, chemical vapor deposition (CVD), sputtering, ion implantation, ashing, or the like is performed, an electrostatic chuck is used as a member for clamping and holding a process object such as a semiconductor wafer or a glass substrate. The electrostatic chuck applies an electrostatic clamping power to built-in electrodes and clamps a substrate such as a silicon wafer by an electrostatic force.

In recent years, IC chips including semiconductor elements such as transistors have been required to be miniaturized and improved in processing speed. Along with this requirement, in forming the semiconductor element on a wafer, it is required to improve processing accuracy of etching or the like. The processing accuracy of etching indicates whether or not a pattern having a width and depth as designed can be formed by processing a wafer. By increasing the processing accuracy of etching or the like, the semiconductor element can be miniaturized, and the integration density can be increased. That is, by increasing the processing accuracy, it is possible to reduce the size of the chip and to increase the speed of the chip.

It is known that the processing accuracy of etching or the like is dependent on the temperature of a wafer when processing. Therefore, to make the etching rate uniform in a substrate processing apparatus including an electrostatic chuck, it is desirable to control the temperature distribution in the wafer surface when processing. A method of using an electrostatic chuck in which a heater (a heating element) is embedded is known as a method of controlling the temperature distribution in the wafer surface (e.g., JP-A 2017-168818).

Especially in recent years, along with the miniaturization of semiconductor elements, faster heating and stricter control of the in-plane temperature distribution have been required, and as a method for implementing this, the use of a two-layer structure of a main heater and a sub-heater as a heater is known (e.g., JP-A 2014-529826). Also, a heater pattern in which the heater includes multiple zones is known (e.g., JP-A 2019-149434).

However, providing multiple zones in the heater allows for fine temperature control, but causes design constraints on the shape of the heater pattern and increases the number of pads, terminals, and the like for feeding power, which results in a new problem, i.e., the degradation of the uniformity of the temperature distribution in the wafer surface due to the occurrence in the heater plane of many cool spots having relatively low temperatures.

Therefore, for example, it may be considered to increase the uniformity of the temperature distribution in the wafer surface by dispersing the cool spots in the heater plane. However, there is a risk that dispersing the cool spots in the heater plane may make the temperature control complex. It is desirable to increase the uniformity of the temperature distribution in the wafer surface while suppressing complex temperature control.

SUMMARY

According to the embodiment, an electrostatic chuck includes a ceramic dielectric substrate, a base plate, and a heater unit. The ceramic dielectric substrate has a first major surface and a second major surface. The first major surface is configured to have a process object placed thereon. The second major surface is opposite to the first major surface. The base plate supports the ceramic dielectric substrate. The heater unit heats the ceramic dielectric substrate. The heater unit includes a first power feeding portion, a second power feeding portion, and a heater line. The second power feeding portion is adjacent to the first power feeding portion. The heater line emits heat by allowing a current to flow. The heater line is one electrode connecting the first and second power feeding portions. The heater line includes a plurality of extension portions arranged in a second direction. The second direction is perpendicular to a first direction. The plurality of extension portions extends along the first direction. The plurality of extension portions includes a first extension portion and a second extension portion. The first extension portion is adjacent to the first and second power feeding portions at one side in the second direction. The second extension portion is adjacent to the first and second power feeding portions at an other side in the second direction. The first extension portion includes a first portion, a second portion, and a third portion. The first portion overlaps the first power feeding portion in the second direction. The second portion overlaps the second power feeding portion in the second direction. The third portion is positioned between the first portion and the second portion in the first direction. The third portion does not overlap the first and second power feeding portions in the second direction. The second extension portion includes a fourth portion, a fifth portion, and a sixth portion. The fourth portion overlaps the first power feeding portion in the second direction. The fifth portion overlaps the second power feeding portion in the second direction. The sixth portion is positioned between the fourth portion and the fifth portion in the first direction. The sixth portion does not overlap the first and second power feeding portions in the second direction. A first distance is a minimum distance in the first direction between the first power feeding portion and the second power feeding portion. A second distance is a minimum distance in the second direction between the plurality of extension portions. A third distance is a distance in the second direction between the first extension portion and a first virtual tangent. The first virtual tangent contacts the first and second power feeding portions along the first direction at the one side in the second direction. A fourth distance is a distance in the second direction between the second extension portion and a second virtual tangent. The second virtual tangent contacts the first and second power feeding portions along the first direction at the other side in the second direction. The third distance and the fourth distance each are not more than the first distance. The third distance and the fourth distance each are not more than the second distance.

DETAILED DESCRIPTION

Figure 1:
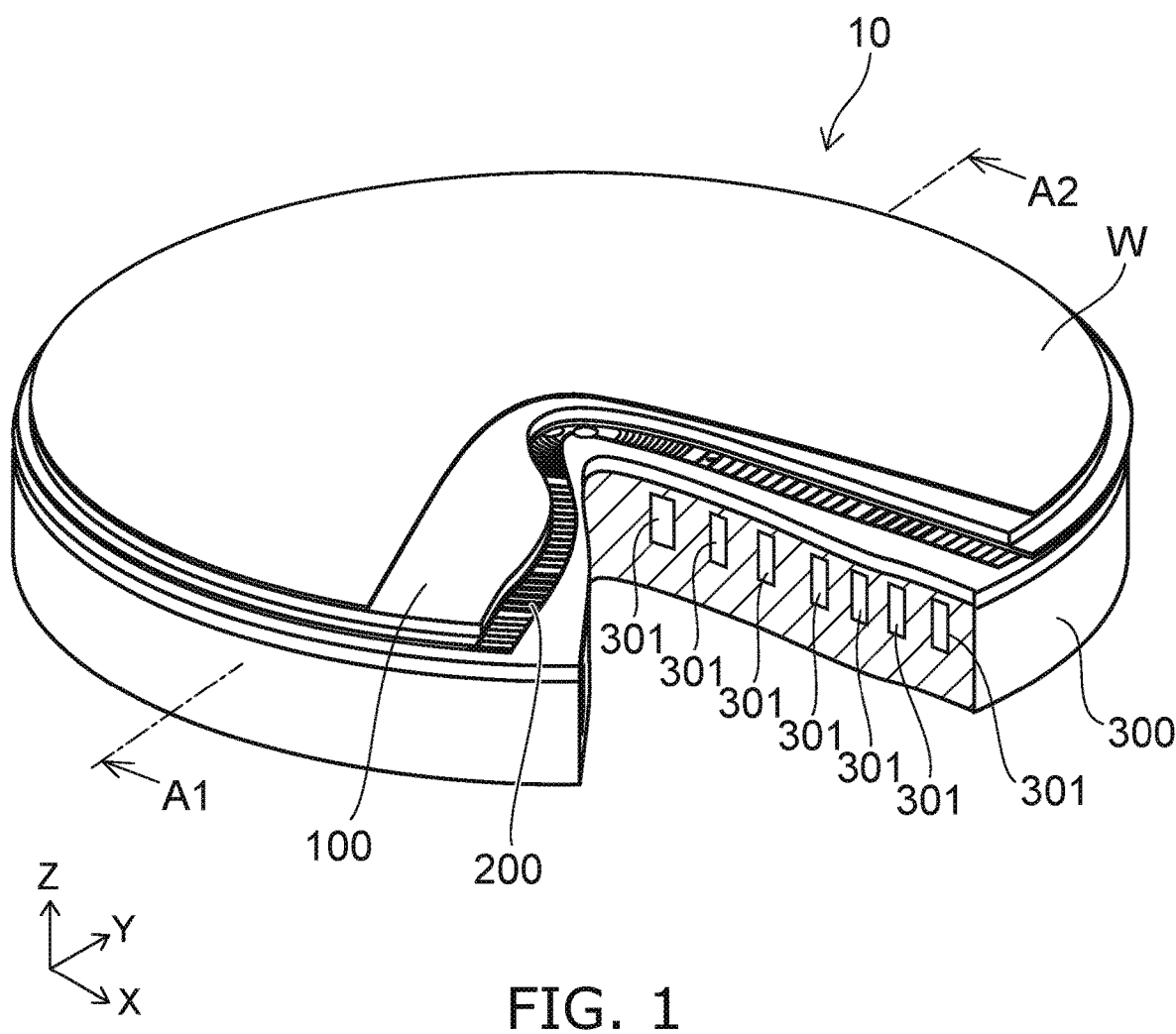
FIG. 1 is a perspective view schematically illustrating an electrostatic chuck according to an embodiment.

A first invention is an electrostatic chuck including a ceramic dielectric substrate, a base plate supporting the ceramic dielectric substrate, and a heater unit heating the ceramic dielectric substrate; the ceramic dielectric substrate has a first major surface configured to have a process object placed thereon, and a second major surface opposite to the first major surface; the heater unit includes a first power feeding portion, a second power feeding portion adjacent to the first power feeding portion, and a heater line; the heater line is one electrode connecting the first and second power feeding portions and generates heat by allowing a current to flow; the heater line includes multiple extension portions that are arranged in a second direction perpendicular to a first direction and extend along the first direction; the multiple extension portions include a first extension portion adjacent to the first and second power feeding portions at one side in the second direction, and a second extension portion adjacent to the first and second power feeding portions at another side in the second direction; the first extension portion includes a first portion overlapping the first power feeding portion in the second direction, a second portion overlapping the second power feeding portion in the second direction, and a third portion that is positioned between the first portion and the second portion in the first direction and does not overlap the first and second power feeding portions in the second direction; the second extension portion includes a fourth portion overlapping the first power feeding portion in the second direction, a fifth portion overlapping the second power feeding portion in the second direction, and a sixth portion that is positioned between the fourth portion and the fifth portion in the first direction and does not overlap the first and second power feeding portions in the second direction; a first distance is a minimum distance in the first direction between the first power feeding portion and the second power feeding portion; a second distance is a minimum distance in the second direction between the multiple extension portions; a third distance is a distance in the second direction between the first extension portion and a first virtual tangent; the first virtual tangent contacts the first and second power feeding portions along the first direction at the one side in the second direction; a fourth distance is a distance in the second direction between the second extension portion and a second virtual tangent; the second virtual tangent contacts the first and second power feeding portions along the first direction at the other side in the second direction; the third distance and the fourth distance each are not more than the first distance; and the third distance and the fourth distance each are not more than the second distance.

The first power feeding portion and the second power feeding portion do not generate heat and therefore become cool spots, which may cause degradation of the uniformity of the in-plane temperature distribution of the process object. To increase the uniformity of the in-plane temperature distribution of the heater unit, for example, it may be considered to dispose the first power feeding portion and the second power feeding portion at positions separated from each other. However, when the first power feeding portion and the second power feeding portion are disposed at positions separated from each other, there is a risk that the temperature control may become complex because the cool spots are dispersed. On the other hand, when the first power feeding portion and the second power feeding portion are disposed at positions proximate to each other, there is a risk that the temperatures at the cool spots may be reduced, and the uniformity of the in-plane temperature distribution of the heater unit may degrade. In contrast, according to the electrostatic chuck, the first power feeding portion and the second power feeding portion are disposed at positions proximate to each other, and the portions of the heater line (the first extension portion and the second extension portion) adjacent to the first and second power feeding portions are disposed proximate to the first and second power feeding portions. The dispersion of the cool spots can be suppressed thereby, and a drastic reduction of the temperatures at the cool spots can be suppressed by disposing the heater line (the first extension portion and the second extension portion), i.e., the heat-generating portions, proximate to the cool spots. Accordingly, the uniformity of the in-plane temperature distribution of the process object can be increased while suppressing complex temperature control.

A second invention is the electrostatic chuck of the first invention, wherein the heater unit includes multiple zones; the multiple zones include a first zone that includes the first power feeding portion, the second power feeding portion, and the heater line; the first zone includes a central region positioned at a center of the first zone when viewed along a Z-direction perpendicular to the first major surface; the first zone includes an outer peripheral region positioned outward of the central region when viewed along the Z-direction; and the first power feeding portion and the second power feeding portion are located in the central region.

According to the electrostatic chuck, the first power feeding portion and the second power feeding portion, of which the temperatures are likely to be lower than that of the heater line when the heater unit is heated, are located in the central region, of which the temperature is likely to be higher than that of the outer peripheral region; and the uniformity of the in-plane temperature distribution of the first zone can be increased thereby. The uniformity of the in-plane temperature distribution of the process object can be increased thereby.

A third invention is the electrostatic chuck of the first invention, wherein the heater unit includes multiple zones; the multiple zones include a first zone that includes the first power feeding portion, the second power feeding portion, and the heater line; the first zone includes an outer circumference edge of the heater unit; the first zone includes an inner circumference portion positioned radially inward of a center line of a radial direction; the center line of the radial direction bisects the first zone in the radial direction; the first zone includes an outer circumference portion that is positioned radially outward of the center line of the radial direction and includes the outer circumference edge; and the first power feeding portion and the second power feeding portion are located in the inner circumference portion.

The outermost circumference portion of the process object is likely to have a lower temperature than the inner portion. According to the electrostatic chuck, when the first zone includes the outer circumference edge of the heater unit (i.e., the first zone is positioned at the outermost circumference portion of the heater unit), the first power feeding portion and the second power feeding portion, of which the temperatures are likely to be lower than that of the heater line when the heater unit is heated, are located in the inner circumference portion of the first zone; and the uniformity of the in-plane temperature distribution of the process object can be increased thereby.

A fourth invention is the electrostatic chuck of any one of the first to third inventions, wherein the first direction is a circumferential direction.

According to the electrostatic chuck, the extension portions are easily arranged regularly by setting the first direction to be the circumferential direction. The second distance can be more reliably reduced thereby. Accordingly, the uniformity of the in-plane temperature distribution of the process object can be increased.

A fifth invention is the electrostatic chuck of any one of the first to third inventions, wherein the first direction is a radial direction.

According to the electrostatic chuck, the extension portions are easily arranged regularly by setting the first direction to be the radial direction. The second distance can be more reliably reduced thereby. Accordingly, the uniformity of the in-plane temperature distribution of the process object can be increased.

Hereinafter, embodiments of the invention will be described with reference to the drawings. It is noted that, in each figure, similar components are denoted by the same reference numerals, and detailed description thereof will be omitted as appropriate.

FIG. 1 is a perspective view schematically illustrating an electrostatic chuck according to an embodiment.

Figure 2A:
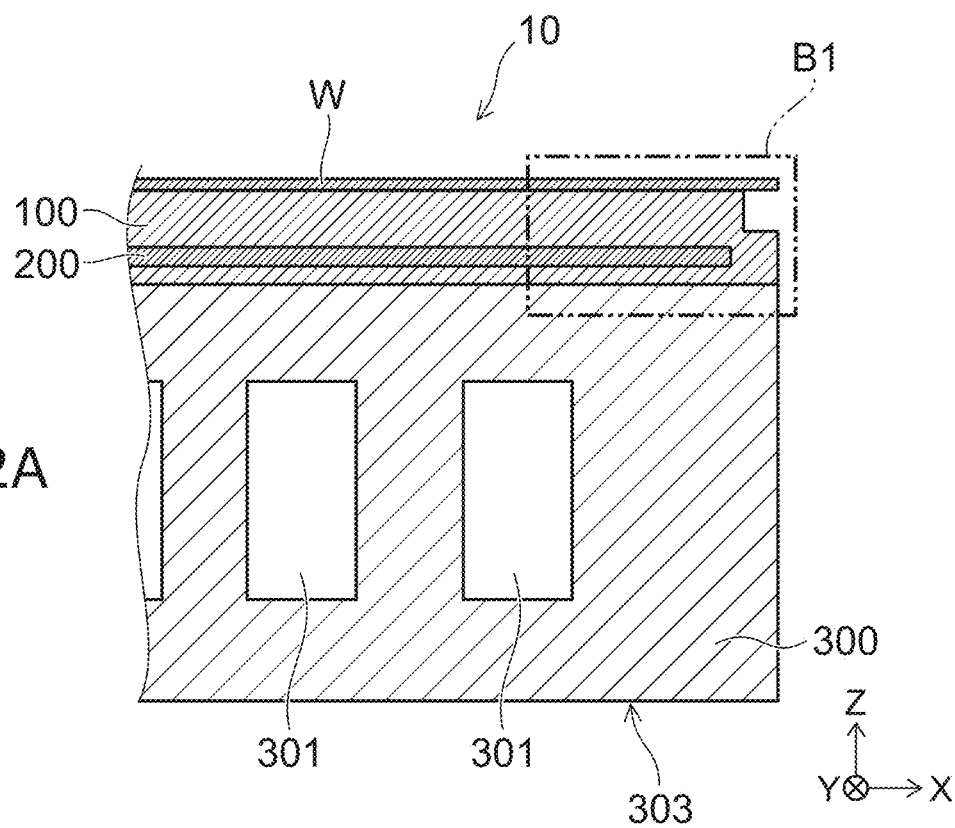
FIGS. 2A and 2B are cross-sectional views schematically illustrating portions of the electrostatic chuck according to the embodiment.
Figure 2B:
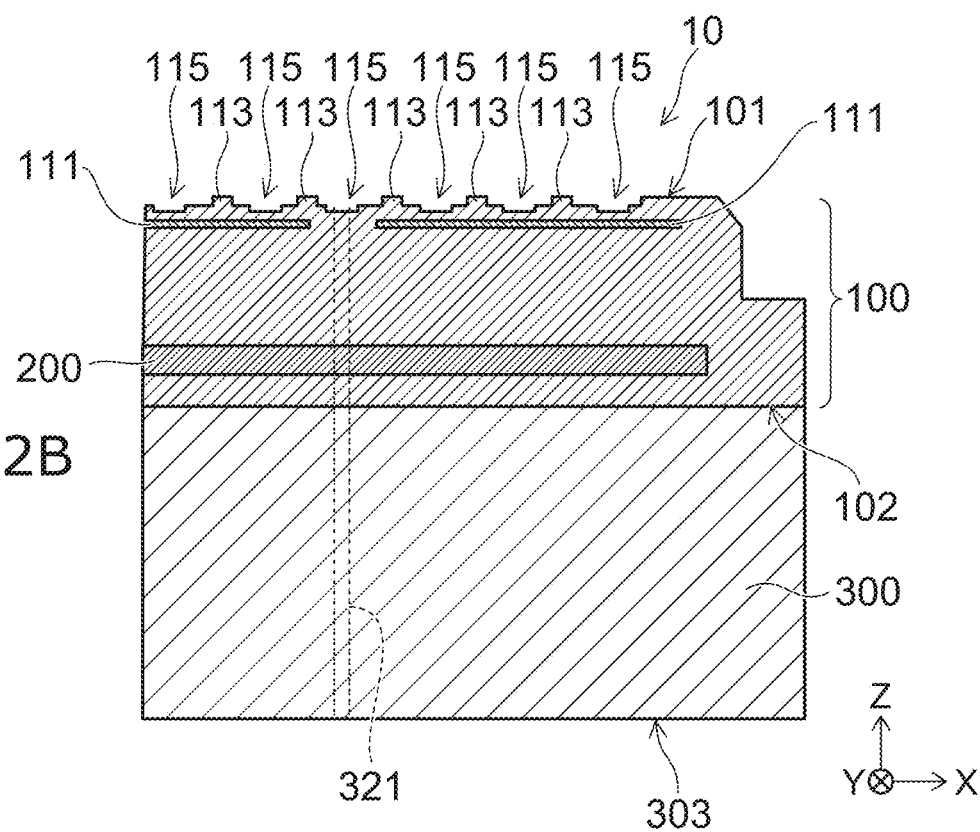

FIGS. 2A and 2B are cross-sectional views schematically illustrating portions of the electrostatic chuck according to the embodiment.

For convenience of description in FIG. 1, a cross-sectional view is illustrated in a portion of the electrostatic chuck.

FIG. 2A is a cross-sectional view along line A1-A2 shown in FIG. 1.

FIG. 2B is an enlarged view of region B1 shown in FIG. 2A. A process object W is not illustrated in FIG. 2B.

As illustrated in FIGS. 1, 2A, and 2B, the electrostatic chuck 10 according to the embodiment includes a ceramic dielectric substrate 100, a heater unit 200, and a base plate 300.

The ceramic dielectric substrate 100 is, for example, a flat plate-shaped base material made of a polycrystalline ceramic sintered body and has a first major surface 101 on which a process object W such as a semiconductor wafer is mounted and a second major surface 102 which is a side opposite to the first major surface 101.

In the specification, the direction perpendicular to the first major surface 101 is defined as a Z-direction. In other words, the Z-direction is a direction connecting the first major surface 101 and the second major surface 102. In other words, the Z-direction is a direction from the base plate 300 toward the ceramic dielectric substrate 100. In addition, one of the directions orthogonal to the Z-direction is defined as an X-direction, and the direction orthogonal to the Z-direction and the X-direction is defined as a Y-direction. In the specification, "in-plane" denotes, for example, in an XY plane. In addition, in the specification, "plan view" indicates a state viewed along the Z-direction.

For example, $Al_2O_3$, AlN, SiC, $Y_2O_3$, YAG, etc., are examples of the material of the crystal included in the ceramic dielectric substrate 100. By using such a material, the infrared transmissivity, thermal conductivity, insulation resistance, and plasma resistance of the ceramic dielectric substrate 100 can be increased.

An electrode layer 111 is provided inside the ceramic dielectric substrate 100. The electrode layer 111 is interposed between the first major surface 101 and the second major surface 102. That is, the electrode layer 111 is formed so as to be inserted into the ceramic dielectric substrate 100. The electrode layer 111 is integrally sintered on the ceramic dielectric substrate 100.

The electrode layer 111 is not limited to being interposed between the first major surface 101 and the second major surface 102, and the electrode layer 111 may be attached to the second major surface 102.

The electrostatic chuck 10 generates charges on the first major surface 101 side of the electrode layer 111 by applying a clamping voltage to the electrode layer 111 and clamps the process object W by the electrostatic force.

The electrode layer 111 is provided along the first major surface 101 and the second major surface 102. The electrode layer 111 is a clamping electrode for clamping the process object W. The electrode layer 111 may be of a unipolar type or a bipolar type. In addition, the electrode layer 111 may be of a tripolar type or of a multipolar type. The number of electrode layers 111 and the arrangement of the electrode layers 111 are appropriately selected.

The base plate 300 is located at the second major surface 102 side of the ceramic dielectric substrate 100 and supports the ceramic dielectric substrate 100. A communicating path 301 is provided in the base plate 300. That is, the communicating path 301 is located inside the base plate 300. For example, aluminum, aluminum alloys, titanium, and titanium alloys are examples of the material of the base plate 300.

The base plate 300 serves to adjust the temperature of the ceramic dielectric substrate 100. For example, in the case of cooling the ceramic dielectric substrate 100, a cooling medium is allowed to flow into the communicating path 301, pass through the communicating path 301, and flow out from the communicating path 301. Accordingly, the heat of the base plate 300 can be absorbed by the cooling medium, and the ceramic dielectric substrate 100 mounted on the base plate 300 can be cooled.

Convex portions 113 are provided on the first major surface 101 side of the ceramic dielectric substrate 100, as needed. Grooves 115 are provided between the adjacent convex portions 113. The grooves 115 communicate with each other. A space is formed between the grooves 115 and a back side of the process object W mounted on the electrostatic chuck 10.

An introduction path 321 penetrating the base plate 300 and the ceramic dielectric substrate 100 is connected to the groove 115. When a transfer gas such as helium (He) is introduced from the introduction path 321 in a state where the process object W is clamped and held, the transfer gas flows into the space provided between the process object W and the groove 115, and the process object W can be directly heated or cooled by the transfer gas.

The heater unit 200 heats the ceramic dielectric substrate 100. The heater unit 200 heats the process object W via the ceramic dielectric substrate 100 by heating the ceramic dielectric substrate 100. In the example, the heater unit 200 is located between the first major surface 101 and the second major surface 102. In other words, the heater unit 200 is formed so as to be inserted into the ceramic dielectric substrate 100. In other words, the heater unit 200 is embedded in the ceramic dielectric substrate 100.

The heater unit 200 may be located separately from the ceramic dielectric substrate 100. In such a case, for example, the heater unit 200 is located between the ceramic dielectric substrate 100 and the base plate 300 with an adhesive layer interposed. The heat-resistant resin that has a relatively high thermal conductivity such as silicone or the like is an example of the material of the adhesive layer.

Figure 3:
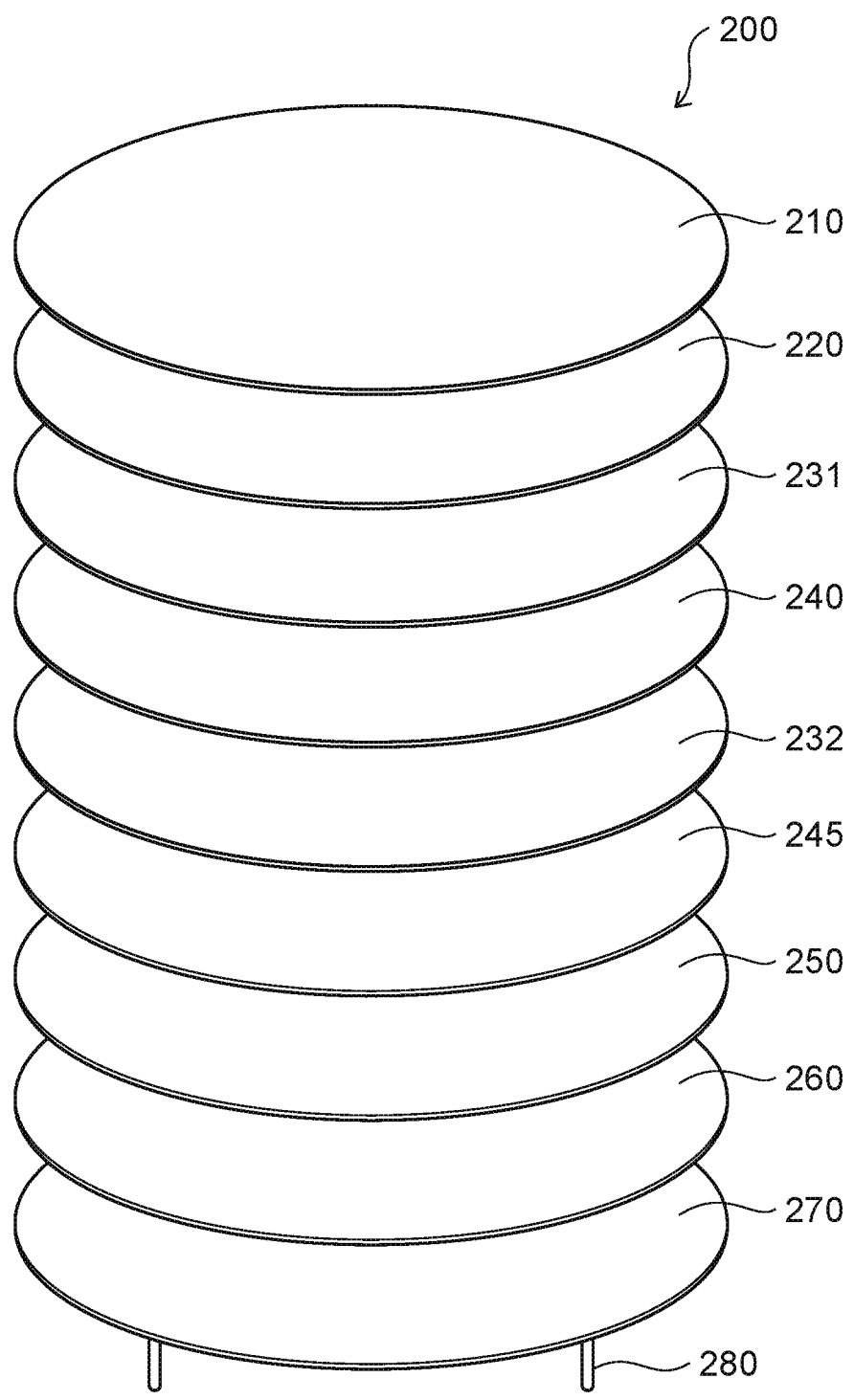
FIG. 3 is an exploded perspective view schematically illustrating the heater unit according to the embodiment.

FIG. 3 is an exploded perspective view schematically illustrating the heater unit according to the embodiment.

Figure 4:
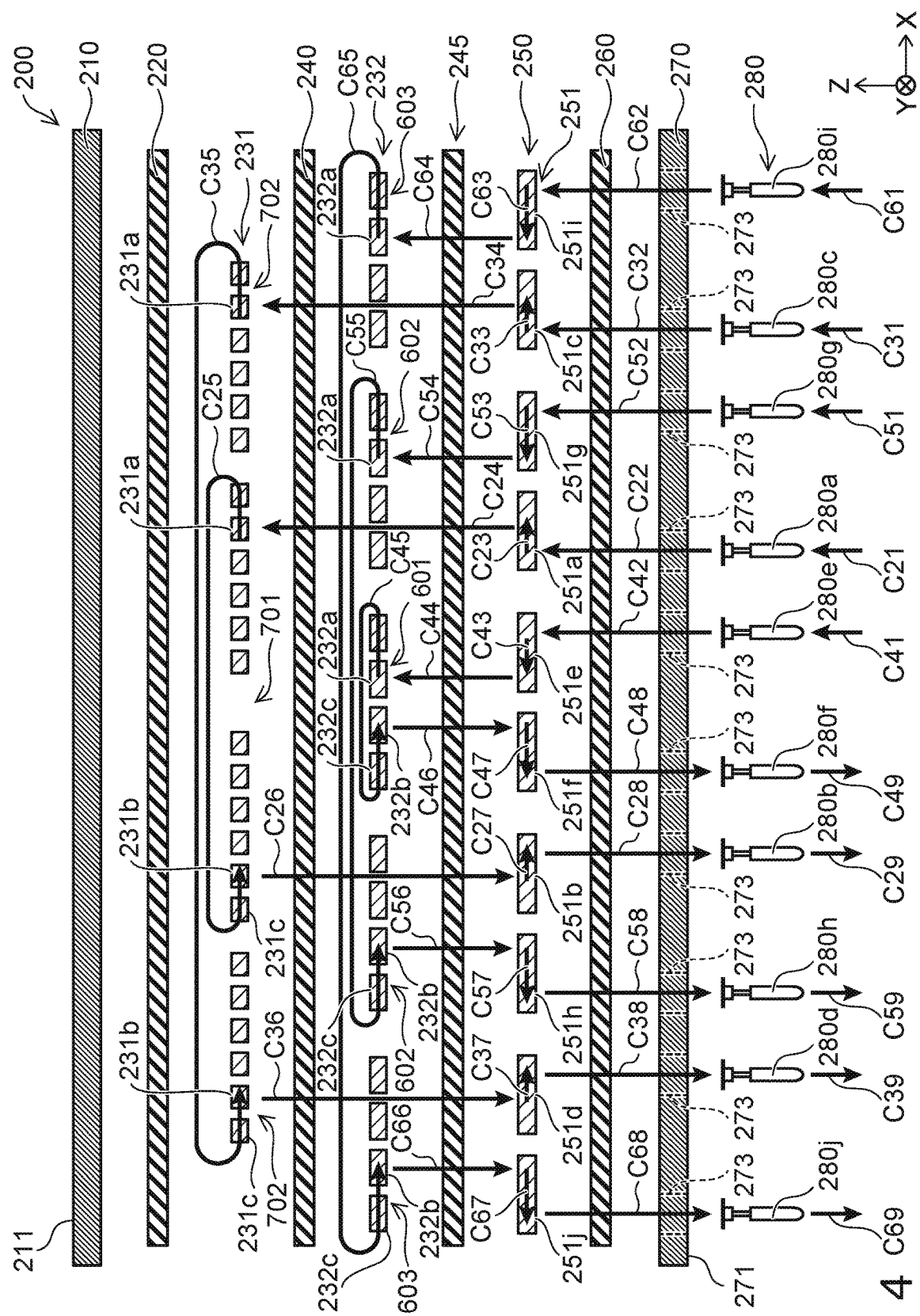
FIG. 4 is an exploded cross-sectional view schematically illustrating the heater unit according to the embodiment.

FIG. 4 is an exploded cross-sectional view schematically illustrating the heater unit according to the embodiment.

In the example as illustrated in FIGS. 3 and 4, the heater unit 200 includes a first support plate 210, a first insulating layer 220, a first heater element 231, a second insulating layer 240, a second heater element 232, a third insulating layer 245, a bypass layer 250, a fourth insulating layer 260, a second support plate 270, and a power feeding terminal 280.

The first support plate 210 is located on the first heater element 231, the second heater element 232, the bypass layer 250, etc. The second support plate 270 is located under the first heater element 231, the second heater element 232, the bypass layer 250, etc. A surface 211 (the upper surface) of the first support plate 210 is the upper surface of the heater unit 200. A surface 271 (the lower surface) of the second support plate 270 is the lower surface of the heater unit 200. When the heater unit 200 is embedded in the ceramic dielectric substrate 100, the first support plate 210 and the second support plate 270 may be omitted.

The first support plate 210 and the second support plate 270 are support plates supporting the sub-heater element 231, the main heater element 232, etc. In the example, the first support plate 210 and the second support plate 270 support the first insulating layer 220, the sub-heater element 231, the second insulating layer 240, the main heater element 232, the third insulating layer 245, the bypass layer 250, and the fourth insulating layer 260 with these components interposed.

The first insulating layer 220 is provided between the first support plate 210 and the second support plate 270. The first heater element 231 is provided between the first insulating layer 220 and the second support plate 270. In this manner, the first heater element 231 is provided so as to overlap the first support plate 210. In other words, the first insulating layer 220 is provided between the first support plate 210 and the first heater element 231. When the heater unit 200 is built in the ceramic dielectric substrate 100, the ceramic dielectric substrate 100 also serves as the first insulating layer 220.

The second insulating layer 240 is provided between the first heater element 231 and the second support plate 270. The second heater element 232 is provided between the second insulating layer 240 and the second support plate 270. In this manner, the second heater element 232 is provided in a layer different from the layer in which the first heater element 231 is provided. At least a portion of the second heater element 232 overlaps the first heater element 231 in the Z-direction. The third insulating layer 245 is provided between the second heater element 232 and the second support plate 270. The bypass layer 250 is provided between the third insulating layer 245 and the second support plate 270. The fourth insulating layer 260 is provided between the bypass layer 250 and the second support plate 270.

In other words, the first heater element 231 is provided between the first insulating layer 220 and the second insulating layer 240. In other words, the second heater element 232 is provided between the second insulating layer 240 and the third insulating layer 245. In other words, the bypass layer 250 is provided between the third insulating layer 245 and the fourth insulating layer 260.

The first heater element 231 is in contact with, for example, each of the first insulating layer 220 and the second insulating layer 240. The second heater element 232 is in contact with, for example, each of the second insulating layer 240 and the third insulating layer 245. The bypass layer 250 is in contact with, for example, each of the third insulating layer 245 and the fourth insulating layer 260.

The bypass layer 250 and the fourth insulating layer 260 are provided as necessary and can be omitted. When the bypass layer 250 and the fourth insulating layer 260 are not provided, the third insulating layer 245 is in contact with the second support plate 270. Hereinafter, a case where the heater unit 200 includes the bypass layer 250 and the fourth insulating layer 260 will be described as an example.

The first support plate 210 has a relatively high thermal conductivity. For example, the thermal conductivity of the first support plate 210 is higher than the thermal conductivity of the first heater element 231 and higher than the thermal conductivity of the second heater element 232. Metals including at least one of aluminum, copper, and nickel, graphite having a multi-layer structure, and the like are examples of the material of the first support plate 210. The thickness (length in the Z-direction) of the first support plate 210 is, for example, about 0.1 mm or more and 3.0 mm or less. Preferably, the thickness of the first support plate 210 is, for example, about 0.3 mm or more and 1.0 mm or less. The first support plate 210 allows the uniformity of the in-plane temperature distribution of the heater unit 200 to be improved. The first support plate 210 functions as, for example, a heat soaking plate. The first support plate 210 suppresses the warping of the heater unit 200. The first support plate 210 allows the adhesive strength between the heater unit 200 and the ceramic dielectric substrate 100 to be improved.

The material, thickness, and function of the second support plate 270 are the same as the material, thickness, and function of the first support plate 210, respectively. For example, the thermal conductivity of the second support plate 270 is higher than the thermal conductivity of the first heater element 231 and higher than the thermal conductivity of the second heater element 232. In the embodiment, at least one of the first support plate 210 and the second support plate 270 may be omitted.

For example, an insulating material such as a resin, a ceramic, etc., can be used as the material of the first insulating layer 220. Polyimide, polyamideimide, etc., are examples when the first insulating layer 220 is a resin. $Al_2O_3$, AlN, SiC, $Y_2O_3$, YAG, etc., are examples when the first insulating layer 220 is a ceramic. The thickness (the Z-direction length) of the first insulating layer 220 is, for example, not less than about 0.01 mm and not more than about 0.20 mm. The first insulating layer 220 bonds the first support plate 210 and the first heater element 231. The first insulating layer 220 electrically insulates between the first support plate 210 and the first heater element 231. Thus, the first insulating layer 220 has an electrical insulation function and a surface bonding function. It is sufficient for the first insulating layer 220 to have at least an insulation function; and the first insulating layer 220 may have other functions such as, for example, a heat conduction function, a diffusion prevention function, etc.

The material and thickness of the second insulating layer 240 are about the same as the material and thickness of the first insulating layer 220, respectively. The material and thickness of the third insulating layer 245 are about the same as the material and thickness of the first insulating layer 220, respectively. The material and thickness of the fourth insulating layer 260 are about the same as the material and thickness of the first insulating layer 220, respectively.

The second insulating layer 240 bonds the first heater element 231 and the second heater element 232. The second insulating layer 240 electrically insulates between the first heater element 231 and the second heater element 232. In this manner, the second insulating layer 240 has the electrical insulation function and the surface bonding function. The second insulating layer 240 may have at least an insulation function and may have other functions such as a heat conduction function and a diffusion prevention function.

The third insulating layer 245 bonds the second heater element 232 and the bypass layer 250. The third insulating layer 245 electrically insulates between the second heater element 232 and the bypass layer 250. In this manner, the third insulating layer 245 has the electrical insulation function and the surface bonding function. The third insulating layer 245 may have at least an insulation function, and may have other functions such as a heat conduction function and a diffusion prevention function.

The fourth insulating layer 260 bonds the bypass layer 250 and the second support plate 270. The fourth insulating layer 260 electrically insulates between the bypass layer 250 and the second support plate 270. In this manner, the fourth insulating layer 260 has the electrical insulation function and the surface bonding function. The fourth insulating layer 260 may have at least an insulation function and may have other functions such as a heat conduction function and a diffusion prevention function.

Metals including at least one of, for example, stainless steel, titanium, chromium, nickel, copper, aluminum, Inconel (registered trademark), molybdenum, tungsten, palladium, platinum, silver, tantalum, molybdenum carbide, and tungsten carbide are examples of materials of the first heater element 231. The thickness (length in the Z-direction) of the first heater element 231 is, for example, about 0.01 mm or more and 0.20 mm or less. The material and thickness of the second heater element 232 are about the same as the material and thickness of the first heater element 231, respectively. Each of the first heater element 231 and the second heater element 232 is electrically connected to, for example, the bypass layer 250. On the other hand, each of the first heater element 231 and the second heater element 232 is electrically insulated from the first support plate 210 and the second support plate 270.

Each of the first heater element 231 and the second heater element 232 generates heat when the current flows. The first heater element 231 and the second heater element 232 heat the ceramic dielectric substrate 100 by generating heat. Since the first heater element 231 and the second heater element 232 heat the process object W through, for example, the ceramic dielectric substrate 100, the in-plane temperature distribution of the process object W is allowed to be uniform. Alternatively, by heating the process object W through, for example, the ceramic dielectric substrate 100, the first heater element 231 and the second heater element 232 may intentionally make a difference in the in-plane temperature of the process object W.

The bypass layer 250 is disposed substantially parallel to the first support plate 210 and substantially parallel to the second support plate 270. The bypass layer 250 includes multiple bypass portions 251. In the example, the bypass layer 250 includes ten bypass portions 251 (bypass portions 251a to 251j). The number of the bypass portions 251 is not limited to "ten". The bypass layer 250 has a plate shape.

The bypass layer 250 has, for example, a conductive property. The bypass layer 250 is electrically connected to, for example, the first heater element 231 and the second heater element 232. The bypass layer 250 is a power feeding path for the first heater element 231 and the second heater element 232. On the other hand, the bypass layer 250 is electrically insulated from, for example, the first support plate 210 and the second support plate 270 by an insulating layer.

The thickness (length in the Z-direction) of the bypass layer 250 is, for example, not less than about 0.03 mm and not more than about 0.30 mm. The thickness of the bypass layer 250 is greater than that of the first insulating layer 220. The thickness of the bypass layer 250 is greater than that of the second insulating layer 240. The thickness of the bypass layer 250 is greater than that of the third insulating layer 245. The thickness of the bypass layer 250 is greater than that of the fourth insulating layer 260.

For example, the material of the bypass layer 250 is the same as the material of the first heater element 231 and the second heater element 232. On the other hand, the thickness of the bypass layer 250 is greater than the thickness of the first heater element 231 and greater than the thickness of the second heater element 232. Therefore, the electric resistance of the bypass layer 250 is lower than the electric resistance of the first heater element 231 and lower than the electric resistance of the second heater element 232. Accordingly, even when the material of the bypass layer 250 is the same as the material of the first heater element 231 and the second heater element 232, it is possible to suppress the bypass layer 250 from generating heat similarly to the first heater element 231 and the second heater element 232. That is, the electric resistance of the bypass layer 250 can be suppressed, and the generated heat amount by the bypass layer 250 can be suppressed.

A method for suppressing the electrical resistance of the bypass layer 250 and suppressing the generated heat amount of the bypass layer 250 may be implemented by using a material having a relatively low volume resistivity instead of the thickness of the bypass layer 250. That is, the material of the bypass layer 250 may be different from the material of the first heater element 231 and the second heater element 232. Metals including at least one of, for example, stainless steel, titanium, chromium, nickel, copper, and aluminum are examples of the material of the bypass layer 250.

The power feeding terminal 280 is electrically connected to the bypass layer 250. In a state where the heater unit 200 is provided between the base plate 300 and the ceramic dielectric substrate 100, the power feeding terminal 280 is provided from the heater unit 200 toward the base plate 300. The power feeding terminal 280 supplies the power supplied from the outside of the electrostatic chuck 10 to the first heater element 231 and the second heater element 232 via the bypass layer 250. The power feeding terminal 280 may be directly connected to, for example, the first heater element 231 and the second heater element 232. Accordingly, the bypass layer 250 can be omitted.

On the other hand, when the first heater element 231 and/or the second heater element 232 has a large number of zones, for example, 20 zones or more, 50 zones or more, or 100 zones or more, it is difficult to arrange the power feeding terminals 280 corresponding to the respective zones. The bypass layer 250 is provided, so that the degree of freedom in arranging the power feeding terminals 280 is improved in comparison with a case where the power feeding terminals 280 is provided for each zone.

The heater unit 200 includes the multiple power feeding terminals 280. In the example, the heater unit 200 includes ten power feeding terminals 280 (power feeding terminals 280a to 280j). The number of the power feeding terminals 280 is not limited to "ten". One power feeding terminal 280 is electrically connected to one bypass portion 251. That is, the number of the power feeding terminals 280 is equal to the number of the bypass portions 251. A hole 273 penetrates the second support plate 270. The power feeding terminal 280 is electrically connected to the bypass portion 251 through the hole 273.

The first heater element 231 includes a first region 701 and a second region 702. Each of the first and second regions 701 and 702 includes a first sub-power feeding portion 231a, a second sub-power feeding portion 231b, and a sub-heater line 231c. The sub-heater line 231c is electrically connected to the first and second sub-power feeding portions 231a and 231b. The first sub-power feeding portion 231a is located at one end of the sub-heater line 231c; and the second sub-power feeding portion 231b is located at the other end of the sub-heater line 231c. The sub-heater line 231c generates heat by allowing a current to flow. The first sub-power feeding portion 231a and the second sub-power feeding portion 231b feed power to the sub-heater line 231c. The first heater element 231 is electrically connected to the bypass layer 250 at the first and second sub-power feeding portions 231a and 231b.

When power is supplied from outside the electrostatic chuck 10 to the power feeding terminal 280a as indicated by arrows C21 and C22 illustrated in FIG. 4, the current flows from the power feeding terminal 280a to the bypass portion 251a. As indicated by arrows C23 and C24 illustrated in FIG. 4, the current flowing to the bypass portion 251a flows from the bypass portion 251a to the first region 701 of the first heater element 231. As indicated by arrows C25 and C26 illustrated in FIG. 4, the current flowing to the first region 701 flows from the first region 701 to the bypass portion 251b. More specifically, the current flowing to the bypass portion 251a flows to the sub-heater line 231c of the first region 701 via the first sub-power feeding portion 231a of the first region 701, and flows to the bypass portion 251b via the second sub-power feeding portion 231b of the first region 701. As indicated by arrows C27 and C28 illustrated in FIG. 4, the current flowing to the bypass portion 251b flows from the bypass portion 251b to the power feeding terminal 280b. As indicated by arrow C29 illustrated in FIG. 4, the current flowing to the power feeding terminal 280b flows outside the electrostatic chuck 10.

Similarly, when the power is supplied from outside the electrostatic chuck 10 to the power feeding terminal 280c, the current flows in the order of the power feeding terminal 280c, the bypass portion 251c, the second region 702 of the first heater element 231, the bypass portion 251d, and the power feeding terminal 280d as indicated by arrows C31 to C39 illustrated in FIG. 4.

The second heater element 232 includes a main zone 601, a main zone 602, and a main zone 603. Each of the main zones 601 to 603 includes a first main power feeding portion 232a, a second main power feeding portion 232b, and a main heater line 232c. The main heater line 232c is electrically connected to the first and second main power feeding portions 232a and 232b. The first main power feeding portion 232a is located at one end of the main heater line 232c; and the second main power feeding portion 232b is located at the other end of the main heater line 232c. The main heater line 232c generates heat by allowing a current to flow. The first main power feeding portion 232a and the second main power feeding portion 232b feed power to the main heater line 232c. The second heater element 232 is electrically connected to the bypass layer 250 at the first and second main power feeding portions 232a and 232b.

As indicated by arrows C41 and C42 illustrated in FIG. 4, when the power is supplied from outside the electrostatic chuck 10 to the power feeding terminal 280e, the current flows from the power feeding terminal 280e to the bypass portion 251e. As indicated by arrows C43 and C44 illustrated in FIG. 4, the current flowing to the bypass portion 251e flows from the bypass portion 251e to the main zone 601 of the second heater element 232. As indicated by arrows C45 and C46 illustrated in FIG. 4, the current flowing to the main zone 601 flows from the main zone 601 to the bypass portion 251f. More specifically, the current flowing to the bypass portion 251e flows to the main heater line 232c of the main zone 601 via the first main power feeding portion 232a of the main zone 601, and flows to the bypass portion 251f via the second main power feeding portion 232b of the main zone 601. As indicated by arrows C47 and C48 illustrated in FIG. 4, the current flowing to the bypass portion 251f flows from the bypass portion 251f to the power feeding terminal 280f. As indicated by arrow C49 illustrated in FIG. 4, the current flowing to the power feeding terminal 280f flows outside the electrostatic chuck 10.

Similarly, when the power is supplied from outside the electrostatic chuck 10 to the power feeding terminal 280g, the current flows in the order of the power feeding terminal 280g, the bypass portion 251g, the main zone 602 of the second heater element 232, the bypass portion 251h, and the power feeding terminal 280h as indicated by arrows C51 to C59.

Similarly, when the power is supplied from outside the electrostatic chuck 10 to the power feeding terminal 280i, the current flows in the order of the power feeding terminal 280i, the bypass portion 251i, the main zone 603 of the second heater element 232, the bypass portion 251j, and the power feeding terminal 280j as indicated by arrows C61 to C69.

For example, the current flowing in the first heater element 231 and the current flowing in the second heater element 232 are separately controlled. In the example, the bypass portions 251 (the bypass portions 251a, 251b, 251c, and 251d) connected to the first heater element 231 and the bypass portions 251 (the bypass portions 251e, 251f, 251g, 251h, 251i, and 251j) connected to the second heater element 232 are different from each other. The bypass portions 251 connected to the first heater element 231 and the bypass portions 251 connected to the second heater element 232 may be the same.

For example, the output of the first heater element 231 and the output of the second heater element 232 can be different by setting the voltage applied to the power feeding terminals 280 (the power feeding terminals 280a, 280b, 280c, and 280d) feeding power to the first heater element 231 and the voltage applied to the power feeding terminals 280 (the power feeding terminals 280e, 280f, 280g, 280h, 280i, and 280j) feeding power to the second heater element 232 to be different from each other. That is, the outputs of the heater elements can be controlled independently.

For example, the current flowing in the first region 701 and the current flowing in the second region 702 of the first heater element 231 are separately controlled. In the example, the bypass portions 251 (the bypass portions 251a and 251b) connected to the first region 701 and the bypass portions 251 (the bypass portions 251c and 251d) connected to the second region 702 are different from each other. The bypass portions 251 connected to the first region 701 and the bypass portions 251 connected to the second region 702 may be the same.

For example, the output of the first region 701 and the output of the second region 702 can be different by setting the voltage applied to the power feeding terminals 280 (the power feeding terminals 280a and 280b) feeding power to the first region 701 and the voltage applied to the power feeding terminals 280 (the power feeding terminals 280c and 280d) feeding power to the second region 702 to be different from each other. That is, the outputs of the regions (the sub-zones) can be controlled independently.

For example, the current flowing in the main zone 601 of the second heater element 232, the current flowing in the main zone 602, and the current flowing in the main zone 603 are separately controlled. In the example, the bypass portions 251 (the bypass portions 251e and 251f) connected to the main zone 601, the bypass portions 251 (the bypass portions 251g and 251h) connected to the main zone 602, and the bypass portions 251 (the bypass portions 251i and 251j) connected to the main zone 603 are different from each other. The bypass portions 251 connected to the main zone 601, the bypass portions 251 connected to the main zone 602, and the bypass portions 251 connected to the main zone 603 may be the same.

For example, the output of the main zone 601, the output of the main zone 602, and the output of the main zone 603 can be different by setting the voltage applied to the power feeding terminals 280 (the power feeding terminals 280e and 280f) feeding power to the main zone 601, the voltage applied to the power feeding terminals 280 (the power feeding terminals 280g and 280h) feeding power to the main zone 602, and the voltage applied to the power feeding terminals 280 (the power feeding terminals 280i and 280j) feeding power to the main zone 603 to be different from each other. That is, the outputs of the main zones can be controlled independently.

The first heater element 231 generates less heat than the second heater element 232. In other words, the first heater element 231 is a low-output sub-heater; and the second heater element 232 is a high-output main heater.

Thus, because the first heater element 231 generates less heat than the second heater element 232, the in-plane temperature unevenness of the process object W caused by the pattern of the second heater element 232 can be suppressed by the first heater element 231. Accordingly, the uniformity of the in-plane temperature distribution of the process object W can be increased.

The volume resistivity of the first heater element 231 is, for example, greater than the volume resistivity of the second heater element 232. The volume resistivity of the first heater element 231 is the volume resistivity of the sub-heater line 231c. That is, the volume resistivity of the first heater element 231 is the volume resistivity between the first sub-power feeding portion 231a and the second sub-power feeding portion 231b. In other words, the volume resistivity of the first heater element 231 is the volume resistivity of the path indicated by arrows C25 and C35 of FIG. 4. Similarly, the volume resistivity of the second heater element 232 is the volume resistivity of the main heater line 232c. That is, the volume resistivity of the second heater element 232 is the volume resistivity between the first main power feeding portion 232a and the second main power feeding portion 232b. In other words, the volume resistivity of the second heater element 232 is the volume resistivity of the path indicated by arrow C45, arrow C55, and arrow C65 of FIG. 4.

Thus, the output (generated heat amount, power consumption) of the first heater element 231 can be set to be less than the output (generated heat amount, power consumption) of the second heater element 232 by setting the volume resistivity of the first heater element 231 to be greater than the volume resistivity of the second heater element 232. Accordingly, the in-plane temperature unevenness of the process object W caused by the pattern of the second heater element 232 can be suppressed by the first heater element 231. Accordingly, the uniformity of the in-plane temperature distribution of the process object can be increased.

Temperature singularities (points where the temperatures are relatively significantly different from the surrounding regions) tend to occur around the power feeding terminals 280. In contrast, by providing the bypass layer 250, the degree of freedom in arranging the power feeding terminals 280 can be increased. For example, the power feeding terminals 280 that tend to have temperature singularities can be arranged in a dispersed manner, so that the heat is easily diffused around the singularities. The uniformity of the in-plane temperature distribution of the process object W can be increased thereby.

By providing the bypass layer 250, the power feeding terminals 280 that have large heat capacities can be configured not to be directly connected to the first and second heater elements 231 and 232. The uniformity of the in-plane temperature distribution of the process object W can be increased thereby. By providing the bypass layer 250, the power feeding terminals 280 may not necessarily be directly connected to the first and second heater elements 231 and 232 that are relatively thin. The reliability of the heater unit 200 can be increased thereby.

As described above, the power feeding terminal 280 is provided from the heater unit 200 toward the base plate 300. Therefore, power can be supplied from the side of a lower surface 303 (see FIGS. 2A and 2B) of the base plate 300 to the power feeding terminal 280 via a member called a socket or the like. Accordingly, the wiring of the heater is implemented while suppressing exposure of the power feeding terminal 280 in the chamber in which the electrostatic chuck 10 is installed.

In the example, the first heater element 231 is located above the second heater element 232. In other words, the first heater element 231 is provided between the second heater element 232 and the first major surface 101. The position of the first heater element 231 and the position of the second heater element 232 may be opposite to each other. That is, the second heater element 232 may be located above the first heater element 231. In other words, the second heater element 232 may be provided between the first major surface 101 and the first heater element 231. From the viewpoint of temperature control, it is favorable that the first heater element 231 is located above the second heater element 232.

When the first heater element 231 is located above the second heater element 232, the distance between the first heater element 231 and the process object W is shorter than the distance between the second heater element 232 and the process object W. Since the first heater element 231 is relatively close to the process object W, the temperature of the process object W can be easily controlled by the first heater element 231. That is, the in-plane temperature unevenness of the process object W caused by the pattern of the second heater element 232 can be easily suppressed by the first heater element 231. Therefore, the uniformity of the in-plane temperature distribution of the process object W can be improved.

On the other hand, when the second heater element 232 is located above the first heater element 231, the high power second heater element 232 is relatively close to the process object W. Accordingly, it is possible to improve the temperature responsiveness (temperature raising rate/temperature lowering rate) of the process object W.

In the example, the second heater element 232 is provided between the bypass layer 250 and the first heater element 231 in the Z-direction. That is, the bypass layer 250 is located below the first heater element 231 and the second heater element 232.

Thus, since the second heater element 232 is provided between the bypass layer 250 and the first heater element 231 in the Z-direction, the first heater element 231 and the second heater element 232 can be disposed on one side of the bypass layer 250. Accordingly, when the power feeding terminal 280 is connected to the bypass layer 250, the power feeding terminal 280 can be connected to the bypass layer 250 from the side opposite to the first heater element 231 and the second heater element 232. Therefore, a hole part for passing the power feeding terminal 280 in the first heater element 231 or the second heater element 232 does not need to be provided, and the number of temperature singular points on the heater pattern can be reduced, so that the uniformity of the in-plane temperature distribution of the first heater element 231 or the second heater element 232 can be improved.

The bypass layer 250 may be located above the first heater element 231 and the second heater element 232. That is, the bypass layer 250 may be provided between the first support plate 210 and the first heater element 231. The bypass layer 250 may be provided between the first support plate 210 and the second heater element 232. The bypass layer 250 may be located between the first heater element 231 and the second heater element 232.

The number of heater elements included in the heater unit 200 is not limited to "two". That is, the heater unit 200 may further include another heater element located in a different layer from the first and second heater elements 231 and 232. The heater unit 200 may include only one of the first heater element 231 or the second heater element 232. That is, one of the first heater element 231 or the second heater element 232 may be omitted.

Figure 5:
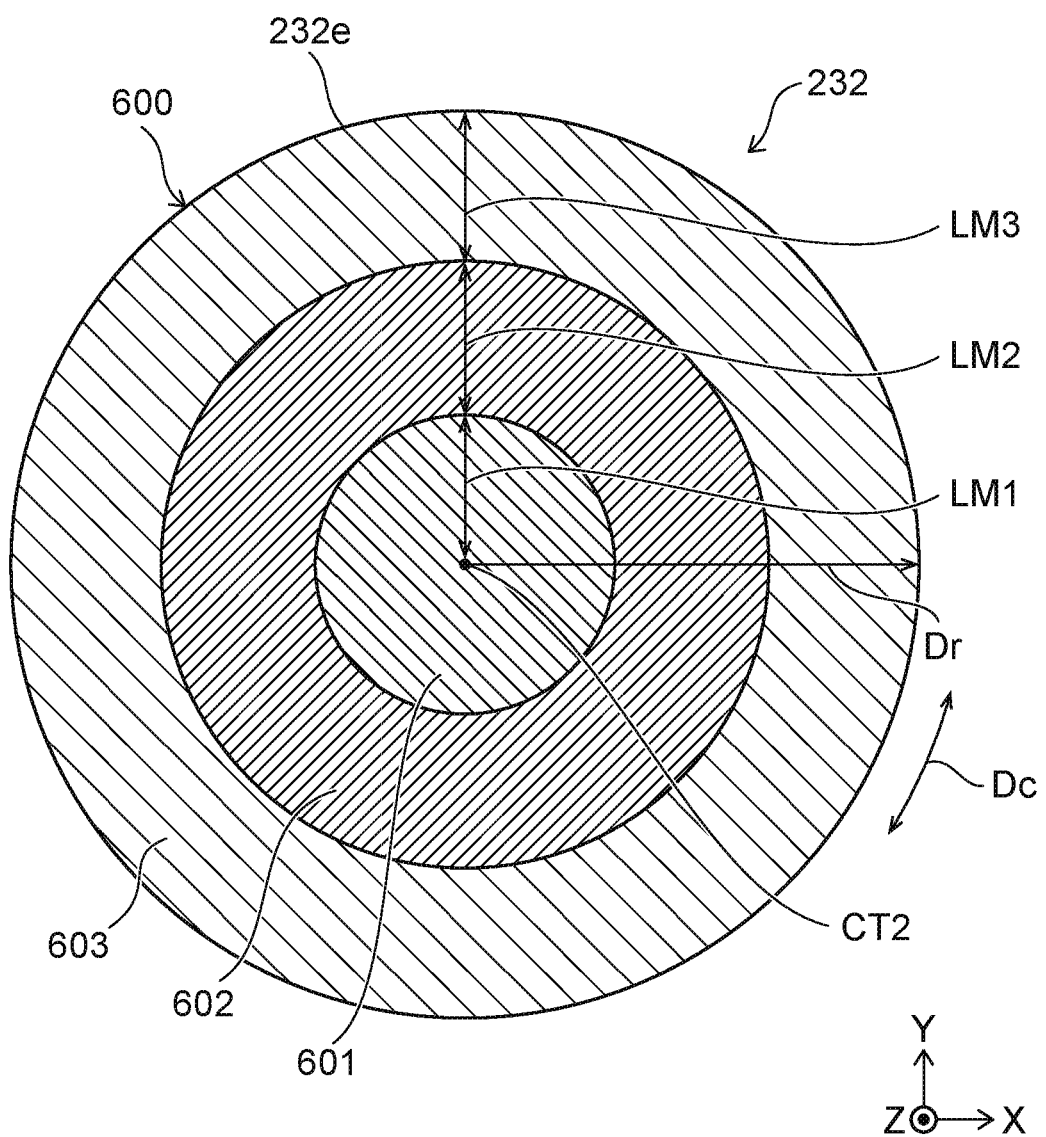
FIG. 5 is a plan view schematically illustrating main zones of the second heater element according to the first embodiment.

FIG. 5 is a plan view schematically illustrating main zones of the second heater element according to the first embodiment.

FIG. 5 is a view in which the second heater element 232 according to FIG. 3 is projected onto a plane perpendicular to the Z-direction.

As illustrated in FIG. 5, the second heater element 232 includes multiple main zones 600 divided in a radial direction Dr. In the second heater element 232, for example, independent temperature control is performed in each of the main zones 600.

In this specification, the "radial direction Dr" is a direction from the center of the heater element toward the outer circumference along a radius. A "circumferential direction Dc" is a direction along the outer circumference of the heater element.

In the example, the multiple main zones 600 have three main zones 601 to 603 aligned in the radial direction Dr. That is, the second heater element 232 is divided into three zones in the radial direction Dr. The main zones 600 are arranged in the order of the main zone 601, the main zone 602, and the main zone 603 from a center CT2 of the second heater element 232 toward the outside in the radial direction Dr.

In the example, the main zone 601 has a circular shape centered on the center CT2 when viewed in plan. The main zone 602 has an annular shape centered on the center CT2 positioned outside the main zone 601 when viewed in plan. The main zone 603 has an annular shape centered on the center CT2 positioned outside the main zone 602 when viewed in plan.

In the example, a width LM1 of the main zone 601 in the radial direction Dr, a width LM2 of the main zone 602 in the radial direction Dr, and a width LM3 of the main zone 603 in the radial direction Dr are the same as each other. The widths LM1 to LM3 may be different from each other.

The number of the main zones 600 and the shape of the main zone 600 when viewed in plan may be arbitrary. The main zone 600 may be divided in the circumferential direction Dc, or may be divided in the circumferential direction Dc and the radial direction Dr.

The main heater lines 232c included in each of the main zones 600 are independent of each other. Accordingly, a different voltage can be applied to each of the main zones 600 (main heater line 232c). Therefore, the output (the generated heat amount) can be controlled independently for each of the main zones 600. In other words, each of the main zones 600 is a heater unit capable of performing independent temperature control in each other, and the second heater element 232 is an aggregate of heater units having multiple heater units.

As described above, each main zone 600 includes one first main power feeding portion 232a, one second main power feeding portion 232b, and one main heater line 232c. The main heater line 232c is one electrode connecting the first and second main power feeding portions 232a and 232b, and generates heat by allowing a current to flow. The main zone 600 is a region that includes the continuous main heater line 232c connecting the first and second main power feeding portions 232a and 232b.

For convenience in FIG. 5, the end portions in the radial direction Dr of the main zones 600 are shown as being in contact with each other, but actually, a gap (i.e., a portion where the main heater line 232c is not provided) exists between the end portions; and the end portions in the radial direction Dr of adjacent main zones do not contact each other. This is the same for the following figures.

Figure 6:
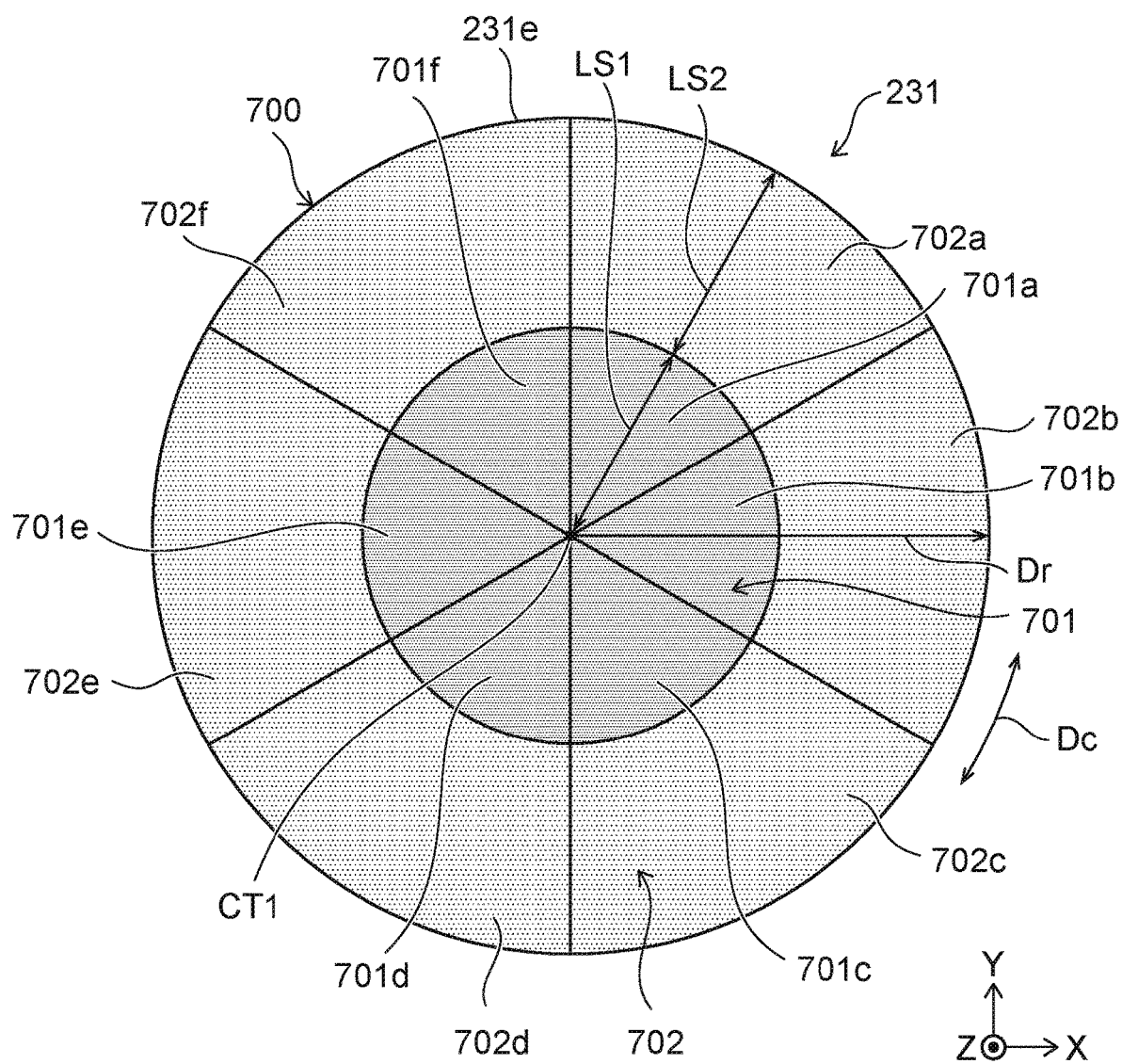
FIG. 6 is a plan view schematically illustrating sub-zones of the first heater element according to the first embodiment.

FIG. 6 is a plan view schematically illustrating sub-zones of the first heater element according to the first embodiment.

FIG. 6 is a view in which the first heater element 231 according to FIG. 3 is projected onto a plane perpendicular to the Z-direction.

In the example as illustrated in FIG. 6, the first heater element 231 includes multiple sub-zones 700 divided in the radial direction Dr and the circumferential direction Dc. In the first heater element 231, independent temperature control is performed in each sub-zone 700.

The multiple sub-zones 700 include the first region 701 made of sub-zones 701a to 701f arranged in the circumferential direction Dc, and the second region 702 made of sub-zones 702a to 702f arranged in the circumferential direction Dc. That is, the second heater element 232 is divided into two zones in the radial direction Dr. The first region 701 and the second region 702 each are divided into six zones in the circumferential direction Dc. The regions are arranged in the order of the first region 701 and the second region 702 from a center CT1 of the first heater element 231 outward in the radial direction Dr.

The first region 701 has a circular shape centered on the center CT1 in a plan view. The second region 702 has an annular shape located outside the first region 701 and centered on the center CT1 in a plan view.

The first region 701 has the sub-zones 701a to 701f. In the first region 701, the sub-zones 701a to 701f are disposed clockwise in the order of the sub-zone 701a, the sub-zone 701b, the sub-zone 701c, the sub-zone 701d, the sub-zone 701e, and the sub-zone 701f. Each of the sub-zones 701a to 701f is a portion of the circular first region 701.

The second region 702 has the sub-zones 702a to 702f. In the second region 702, the sub-zones 702a to 702f are disposed clockwise in the order of the sub-zone 702a, the sub-zone 702b, the sub-zone 702c, the sub-zone 702d, the sub-zone 702e, and the sub-zone 702f. In the example, the sub-zone 702a is located outside the sub-zone 701a. The sub-zone 702b is located outside the sub-zone 701b. The sub-zone 702c is located outside the sub-zone 701c. The sub-zone 702d is located outside the sub-zone 701d. The sub-zone 702e is located outside the sub-zone 701e. The sub-zone 702f is located outside the sub-zone 701f. Each of the sub-zones 702a to 702f is a portion of the annular second region 702.

A width LS1 in the radial direction Dr of the first region 701 and a width LS2 in the radial direction Dr of the second region 702 are, for example, the same. The width LS1 and the width LS2 may be different from each other.

The number of the multiple sub-zones 700 is, for example, greater than the number of the multiple main zones 600. That is, for example, the first heater element 231 is divided into more zones than the second heater element 232. The number of the multiple sub-zones 700 may be equal to the number of the multiple main zones 600 or less than the number of the multiple main zones 600.

The number of the multiple sub-zones 700 included in the first heater element 231 is allowed to be greater than the number of the multiple main zones 600 included in the second heater element 232, so that the first heater element 231 can adjust the temperature in a narrower region than the second heater element 232. Accordingly, the first heater element 231 enables finer adjustment of the temperature, so that the uniformity of the in-plane temperature distribution of the process object W can be improved.

The number of the sub-zones 700 and the shape of the sub-zone 700 when viewed in plan may be arbitrary. The sub-zone 700 may not be divided in the circumferential direction Dc. That is, the first region 701 and/or the second region 702 may not include the multiple sub-zones 700 divided in the circumferential direction Dc.

The sub-heater lines 231c included in each of the sub-zones 700 are independent of each other. Accordingly, a different voltage can be applied to each of the sub-zones 700 (sub-heater line 231c). Therefore, the output (the generated heat amount) can be controlled independently for each of the sub-zones 700. In other words, each of the sub-zones 700 is a heater unit capable of performing independent temperature control in each other, and the first heater element 231 is an aggregate of heater units having multiple heater units.

As described above, each sub-zone 700 includes one first sub-power feeding portion 231a, one second sub-power feeding portion 231b, and one sub-heater line 231c. The sub-heater line 231c is one electrode connecting the first sub-power feeding portion 231a and the second sub-power feeding portion 231b, and generates heat by allowing a current to flow. The sub-zone 700 is a region including the continuous sub-heater line 231c that connects the first sub-power feeding portion 231a and the second sub-power feeding portion 231b.

For convenience in FIG. 6, the end portions in the radial direction Dr of the sub-zones 700 are shown as being in contact with each other, but actually, a gap (i.e., a portion where the sub-heater line 231c is not provided) exists between the end portions; and the end portions in the radial direction Dr of the adjacent sub-zones 700 do not contact each other. This is the same for the following figures.

Figure 7:
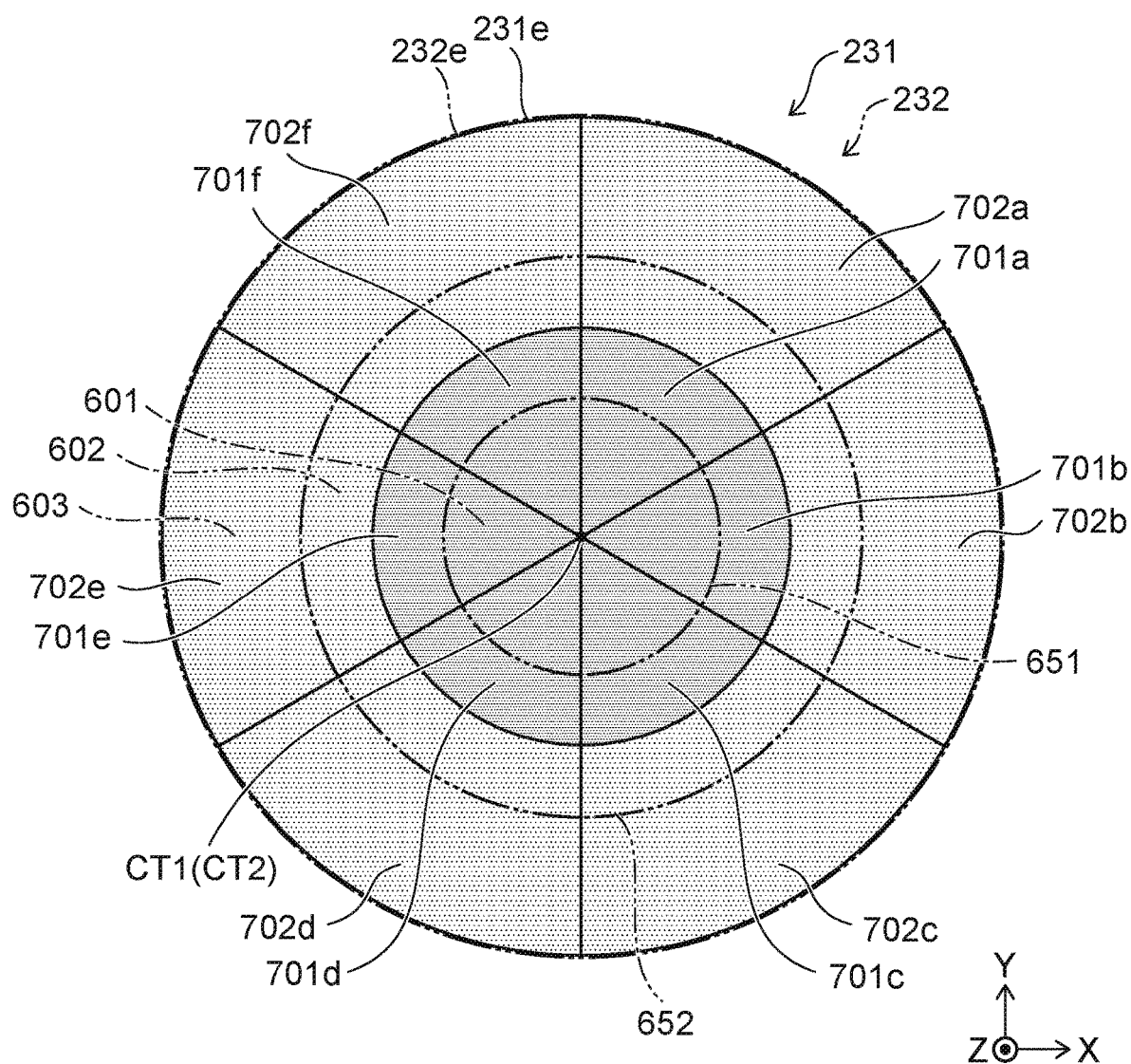
FIG. 7 is a plan view schematically illustrating the positional relationship between the main zones of the second heater element and the sub-zones of the first heater element according to the embodiment.

FIG. 7 is a plan view schematically illustrating the positional relationship between the main zones of the second heater element and the sub-zones of the first heater element according to the embodiment.

FIG. 7 shows the positional relationship when viewed along the Z-direction when the second heater element 232 illustrated in FIG. 5 and the first heater element 231 illustrated in FIG. 6 are overlaid.

In FIG. 7, the main zones 600 of the second heater element 232 are illustrated by double dot-dash lines, and the sub-zones 700 of the first heater element 231 are illustrated by solid lines.

As illustrated in FIG. 7, the first heater element 231 and the second heater element 232 are disposed so that, for example, the center CT1 of the first heater element 231 and the center CT2 of the second heater element 232 overlap each other in the Z-direction. For example, an outer circumference edge 231e of the first heater element 231 and an outer circumference edge 232e of the second heater element 232 also overlap in the Z-direction. The outer circumference edge 231e of the first heater element 231 and the outer circumference edge 232e of the second heater element 232 may not overlap in the Z-direction.

Figure 8:
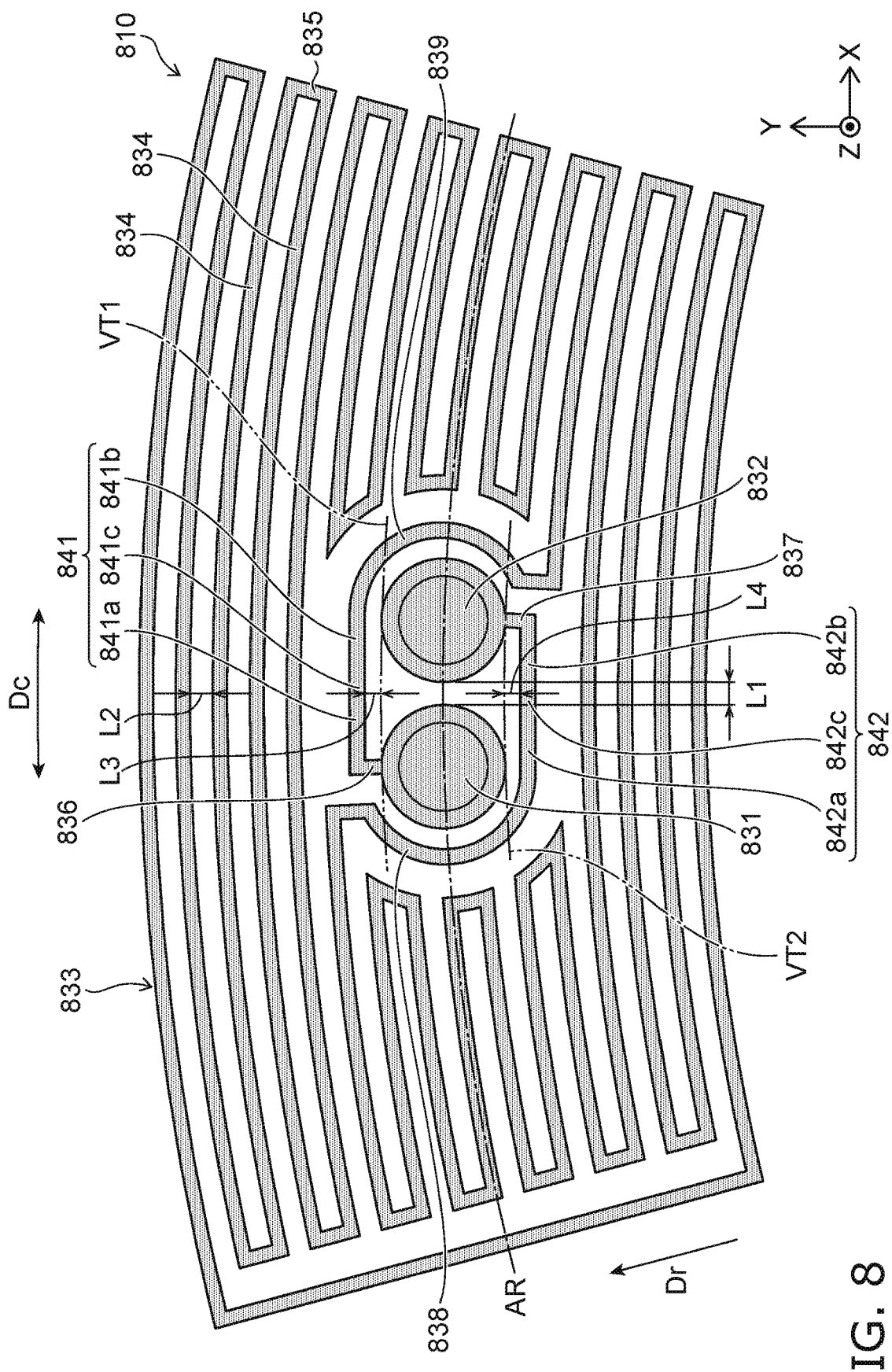
FIG. 8 is a plan view schematically illustrating a first zone of the heater unit according to the first embodiment.

FIG. 8 is a plan view schematically illustrating a first zone of the heater unit according to the first embodiment.

FIG. 8 illustrates an enlarged first zone 810 of the heater unit 200. The first zone 810 is one of the multiple zones included in the heater unit 200. For example, the first zone 810 may be one of the sub-zones 700 of the first heater element 231 or one of the main zones 600 of the second heater element 232.

As illustrated in FIG. 8, the first zone 810 includes a first power feeding portion 831, a second power feeding portion 832, and a heater line 833. When the first zone 810 is one of the sub-zones 700, the first power feeding portion 831, the second power feeding portion 832, and the heater line 833 are respectively the first sub-power feeding portion 231a, the second sub-power feeding portion 231b, and the sub-heater line 231c. When the first zone 810 is one of the main zones 600, the first power feeding portion 831, the second power feeding portion 832, and the heater line 833 are respectively the first main power feeding portion 232a, the second main power feeding portion 232b, and the main heater line 232c.

The second power feeding portion 832 is located at a position adjacent to the first power feeding portion 831. That is, the heater line 833 is not located between the first power feeding portion 831 and the second power feeding portion 832. In other words, the heater line 833 is provided so as to avoid being between the first power feeding portion 831 and the second power feeding portion 832.

The heater line 833 includes multiple extension portions 834 and a folded portion 835. The heater line 833 has a structure in which the multiple extension portions 834 are connected by the folded portion 835. Accordingly, the heater line 833 functions as one electrode connecting the first power feeding portion 831 and the second power feeding portion 832.

The extension portions 834 extend along the first direction. The extension portions 834 are arranged in the second direction. The second direction is perpendicular to the first direction. In the example, the first direction is the circumferential direction Dc; and the second direction is the radial direction Dr. That is, the extension portions 834 extend along the circumferential direction Dc and are arranged in the radial direction Dr.

The multiple extension portions 834 include a first extension portion 841 and a second extension portion 842. The first extension portion 841 is adjacent to the first and second power feeding portions 831 and 832 at one side (the outer side) in the second direction (the radial direction Dr). That is, another extension portion 834 is not provided between the first extension portion 841 and the first power feeding portion 831 or between the first extension portion 841 and the second power feeding portion 832. The second extension portion 842 is adjacent to the first and second power feeding portions 831 and 832 at the other side (the inner side) in the second direction (the radial direction Dr). That is, another extension portion 834 is not provided between the second extension portion 842 and the first power feeding portion 831 or between the second extension portion 842 and the second power feeding portion 832.

The first extension portion 841 includes a first portion 841a, a second portion 841b, and a third portion 841c. The first portion 841a overlaps the first power feeding portion 831 in the second direction (the radial direction Dr). The second portion 841b overlaps the second power feeding portion 832 in the second direction (the radial direction Dr). The third portion 841c is positioned between the first portion 841a and the second portion 841b in the first direction (the circumferential direction Dc). The third portion 841c does not overlap the first and second power feeding portions 831 and 832 in the second direction (the radial direction Dr). That is, the third portion 841c overlaps the gap between the first power feeding portion 831 and the second power feeding portion 832 in the second direction (the radial direction Dr).

The second extension portion 842 includes a fourth portion 842a, a fifth portion 842b, and a sixth portion 842c. The fourth portion 842a overlaps the first power feeding portion 831 in the second direction (the radial direction Dr). The fifth portion 842b overlaps the second power feeding portion 832 in the second direction (the radial direction Dr). The sixth portion 842c is positioned between the fourth portion 842a and the fifth portion 842b in the first direction (the circumferential direction Dc). The sixth portion 842c does not overlap the first and second power feeding portions 831 and 832 in the second direction (the radial direction Dr). That is, the sixth portion 842c overlaps the gap between the first power feeding portion 831 and the second power feeding portion 832 in the second direction (the radial direction Dr).

The fourth portion 842a overlaps the first portion 841a in the second direction (the radial direction Dr). A portion of the first power feeding portion 831 is positioned between the first portion 841a and the fourth portion 842a in the second direction (the radial direction Dr). The fifth portion 842b overlaps the second portion 841b in the second direction (the radial direction Dr). A portion of the second power feeding portion 832 is positioned between the second portion 841b and the fifth portion 842b in the second direction (the radial direction Dr). The sixth portion 842c overlaps the third portion 841c in the second direction (the radial direction Dr). The first power feeding portion 831 and the second power feeding portion 832 are not provided between the third portion 841c and the sixth portion 842c in the second direction (the radial direction Dr). That is, the gap between the first power feeding portion 831 and the second power feeding portion 832 is positioned between the third portion 841c and the sixth portion 842c in the second direction (the radial direction Dr).

The first power feeding portion 831 is connected to the first portion 841a of the first extension portion 841 via a first connection portion 836. The first connection portion 836 extends from the first power feeding portion 831 toward one side (the outer side) in the second direction (the radial direction Dr). The second portion 841b of the first extension portion 841 is connected to a second curved portion 839 that extends along the exterior shape of the second power feeding portion 832.

The second power feeding portion 832 is connected to the fifth portion 842b of the second extension portion 842 via a second connection portion 837. The second connection portion 837 extends from the second power feeding portion 832 toward the other side (the inner side) in the second direction (the radial direction Dr). Thus, for example, the second connection portion 837 extends toward the side opposite to the first connection portion 836. The fourth portion 842a of the second extension portion 842 is connected to a first curved portion 838 that extends along the exterior shape of the first power feeding portion 831.

The minimum distance in the first direction (the circumferential direction Dc) between the first power feeding portion 831 and the second power feeding portion 832 is taken as a first distance L1. The minimum distance in the second direction (the radial direction Dr) between the multiple extension portions 834 is taken as a second distance L2.

The second distance L2 is, for example, equal to the first distance L1. It is favorable to set the first distance L1 to be less than the second distance L2 so that the first and second power feeding portions 831 and 832 which may become cool spots can be sufficiently proximate. The distance in the second direction between the multiple extension portions 834 may not be constant. In such a case, the minimum distance in the second direction between the multiple extension portions 834 is taken as the second distance L2. The first distance L1 is, for example, not less than 0.1 mm and not more than 2.0 mm. The second distance L2 is, for example, not less than 0.2 mm and not more than 2.0 mm.

The distance in the second direction (the radial direction Dr) between a first virtual tangent VT1 and the first extension portion 841 is taken as a third distance L3. The first virtual tangent VT1 is a tangent along the first direction (the circumferential direction Dc) contacting the first and second power feeding portions 831 and 832 at the one side (the outer side) in the second direction (the radial direction Dr). The third distance L3 is, for example, the distance in the second direction (the radial direction Dr) between the first virtual tangent VT1 and the third portion 841c of the first extension portion 841. The third distance L3 is not more than the first distance L1. The third distance L3 is, for example, less than the first distance L1. The third distance L3 is, for example, greater than half of the first distance L1. The third distance L3 is not more than the second distance L2. The third distance L3 is, for example, less than the second distance L2. The third distance L3 is, for example, not less than 0.05 mm and not more than 0.6 mm, and favorably not less than 0.1 mm and not more than 0.3 mm.

The distance in the second direction (the radial direction Dr) between a second virtual tangent VT2 and the second extension portion 842 is taken as a fourth distance L4. The second virtual tangent VT2 is a tangent along the first direction (the circumferential direction Dc) contacting the first and second power feeding portions 831 and 832 at the other side (the inner side) in the second direction (the radial direction Dr). The fourth distance L4 is, for example, the distance in the second direction (the radial direction Dr) between the second virtual tangent VT2 and the sixth portion 842c of the second extension portion 842. The fourth distance L4 is not more than the first distance L1. The fourth distance L4 is, for example, less than the first distance L1. The fourth distance L4 is, for example, greater than half of the first distance L1. The fourth distance L4 is not more than the second distance L2. The fourth distance L4 is, for example, less than the second distance L2. The fourth distance L4 is, for example, greater than half of the second distance L2. The fourth distance L4 is, for example, not less than 0.04 mm and not more than 0.6 mm. It is favorable for the fourth distance L4 to be, for example, equal to the third distance L3. The fourth distance L4 may be greater than the third distance L3 or less than the third distance L3.

The first power feeding portion 831 and the second power feeding portion 832 do not generate heat and therefore become cool spots having relatively low temperatures in the plane of the heater unit 200, which may cause degradation of the uniformity of the in-plane temperature distribution of the process object W. To increase the uniformity of the in-plane temperature distribution of the heater unit 200, for example, it may be considered to dispose the first power feeding portion 831 and the second power feeding portion 832 at positions separated from each other. However, when the first power feeding portion 831 and the second power feeding portion 832 are disposed at positions separated from each other, there is a risk that the temperature control may become complex due to the dispersion of the cool spots. On the other hand, when the first power feeding portion 831 and the second power feeding portion 832 are disposed at positions proximate to each other, the temperatures at the cool spots are reduced, and there is a risk that the uniformity of the in-plane temperature distribution of the heater unit 200 may degrade.

In contrast, in the electrostatic chuck 10 according to the embodiment, the first power feeding portion 831 and the second power feeding portion 832 are disposed at positions proximate to each other, and the portions of the heater line 833 (the first extension portion 841 and the second extension portion 842) adjacent to the first and second power feeding portions 831 and 832 are disposed proximate to the first and second power feeding portions 831 and 832. More specifically, the third distance L3 and the fourth distance L4 each are not more than the first distance L1 and not more than the second distance L2. The dispersion of the cool spots can be suppressed thereby, and because a heat-generating portion, i.e., the heater line 833 (the first extension portion 841 and the second extension portion 842) is disposed proximate to the cool spots, a drastic reduction of the temperatures at the cool spots can be suppressed. Accordingly, the uniformity of the in-plane temperature distribution of the process object W can be increased while suppressing complex temperature control.

Figure 9:
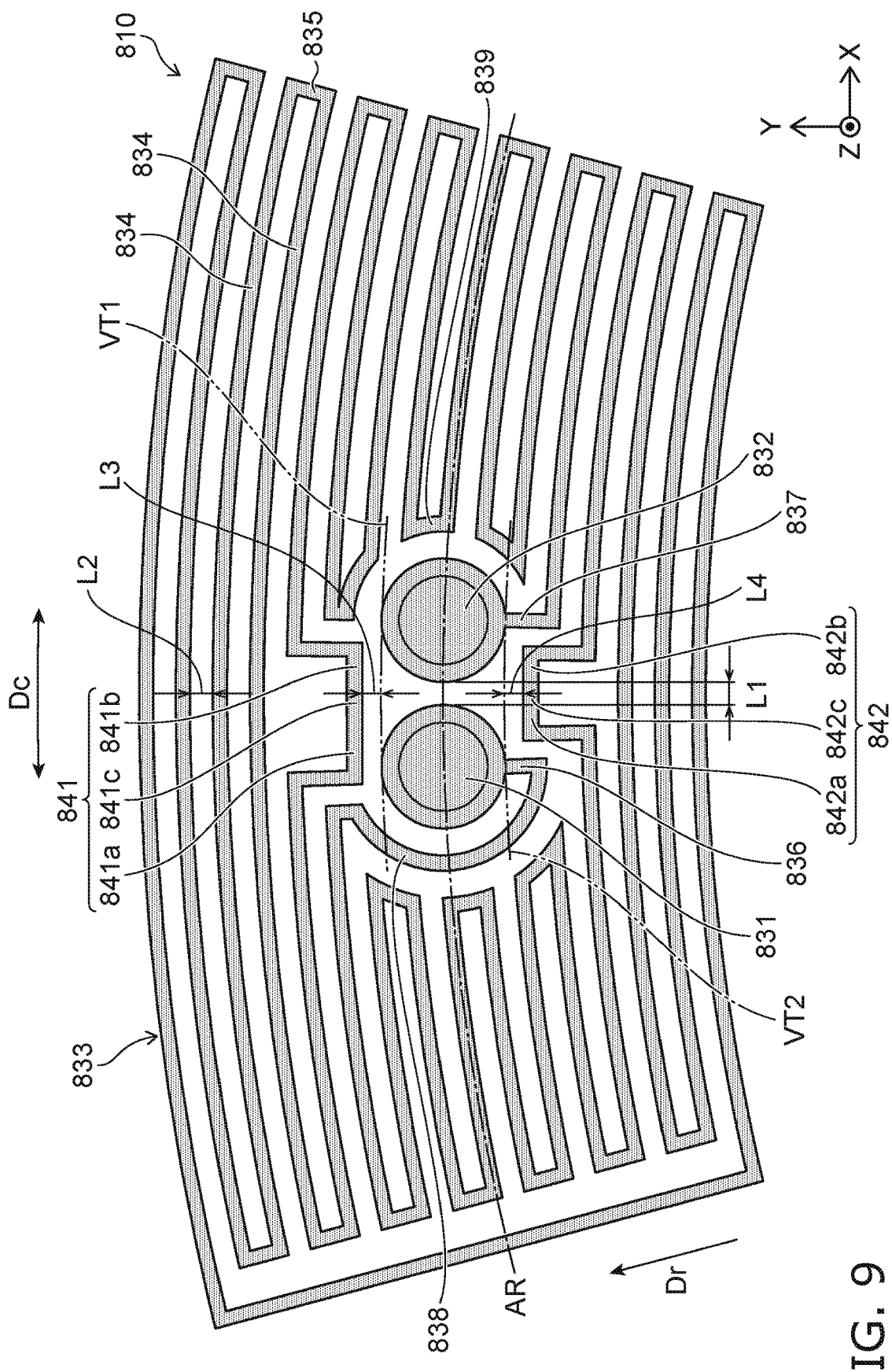
FIG. 9 is a plan view schematically illustrating a first zone of a heater unit according to a second embodiment.

FIG. 9 is a plan view schematically illustrating a first zone of a heater unit according to a second embodiment.

In the example as illustrated in FIG. 9, the first connection portion 836 extends from the first power feeding portion 831 toward the other side (the inner side) in the second direction (the radial direction Dr). The first power feeding portion 831 is not directly connected to the first extension portion 841. That is, the first connection portion 836 is not directly connected to the first extension portion 841. The first connection portion 836 is connected to the first curved portion 838 extending along the exterior shape of the first power feeding portion 831.

The second connection portion 837 extends from the second power feeding portion 832 toward the other side (the inner side) in the second direction (the radial direction Dr). Thus, for example, the second connection portion 837 may extend toward the same side as the first power feeding portion 831. The second power feeding portion 832 is not directly connected to the second extension portion 842. That is, the second connection portion 837 is not directly connected to the second extension portion 842. The second connection portion 837 is not directly connected to the first curved portion 838 extending along the exterior shape of the second power feeding portion 832.

In the example as well, the third distance L3 and the fourth distance L4 each are not more than the first distance L1. The third distance L3 and the fourth distance L4 each are not more than the second distance L2. In the example as well, the uniformity of the in-plane temperature distribution of the process object W can be increased while suppressing complex temperature control because the first power feeding portion 831 and the second power feeding portion 832 are disposed at positions proximate to each other, and the portions of the heater line 833 (the first extension portion 841 and the second extension portion 842) adjacent to the first and second power feeding portions 831 and 832 are disposed proximate to the first and second power feeding portions 831 and 832.

Figure 10:
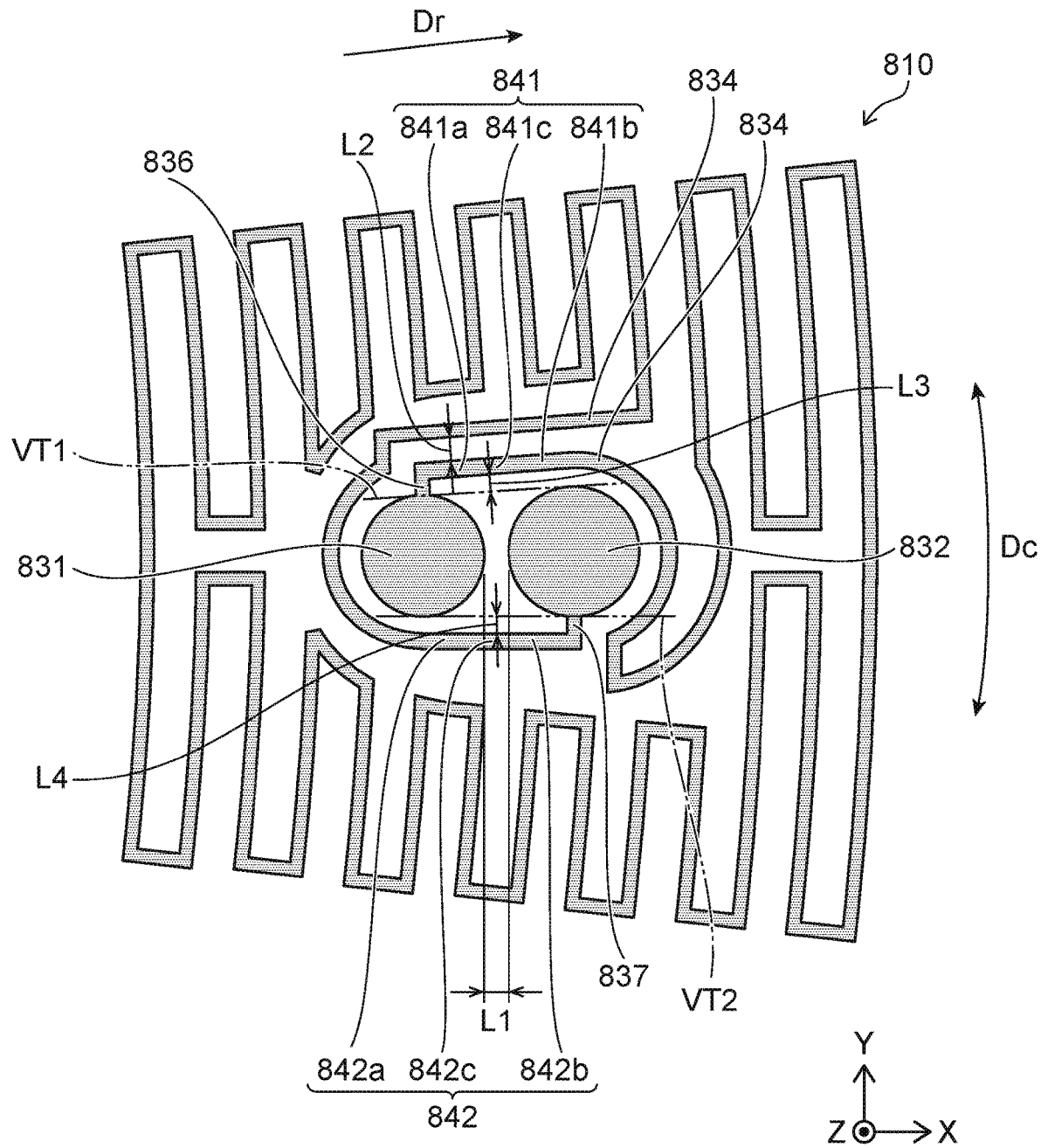
FIG. 10 is a plan view schematically illustrating a first zone of a heater unit according to a third embodiment.

FIG. 10 is a plan view schematically illustrating a first zone of a heater unit according to a third embodiment.

In the example as illustrated in FIG. 10, the first direction is the radial direction Dr, and the second direction is the circumferential direction Dc. That is, the extension portions 834 extend along the radial direction Dr and are arranged in the circumferential direction Dc.

The first connection portion 836 extends from the first power feeding portion 831 toward one side in the second direction (the circumferential direction Dc) and is connected to the first portion 841*a* of the first extension portion 841. The second portion 841*b* of the first extension portion 841 is connected to the second curved portion 839 extending along the exterior shape of the second power feeding portion 832. The second connection portion 837 extends from the second power feeding portion 832 toward the other side in the second direction (the circumferential direction Dc) and is connected to the fifth portion 842*b* of the second extension portion 842. The fourth portion 842*a* of the second extension portion 842 is connected to the first curved portion 838 extending along the exterior shape of the first power feeding portion 831.

In the example as well, the third distance L3 and the fourth distance L4 each are not more than the first distance L1. The third distance L3 and the fourth distance L4 each are not more than the second distance L2. In the example as well, the uniformity of the in-plane temperature distribution of the process object W can be increased while suppressing complex temperature control because the first power feeding portion 831 and the second power feeding portion 832 are disposed at positions proximate to each other, and the portions of the heater line 833 (the first extension portion 841 and the second extension portion 842) adjacent to the first and second power feeding portions 831 and 832 are disposed proximate to the first and second power feeding portions 831 and 832.

FIGS. 11 to 14 are plan views schematically illustrating portions of first zones of heater units according to modifications of the embodiment.

In FIGS. 11 to 14, the first direction is indicated by D1, and the second direction is indicated by D2.

In FIGS. 11 to 14, only a portion of the first zone 810 is illustrated, and the distance L2 is not illustrated.

As illustrated in FIGS. 11 to 14, the first connection portion 836 and the second connection portion 837 may be located at any position that avoids the region between the first power feeding portion 831 and the second power feeding portion 832. For example, the first connection portion 836 may extend in one of one side in the first direction (the side opposite to the second power feeding portion 832), one side in the second direction, or the other side in the second direction. For example, the second connection portion 837 may extend in one of the other side in the first direction (the side opposite to the first power feeding portion 831), the one side in the second direction, or the other side in the second direction. The second connection portion 837 may extend toward the side opposite to the first connection portion 836, may extend toward the same side as the first connection portion 836, or may extend in an orientation crossing the orientation in which the first connection portion 836 extends.

Figure 11:
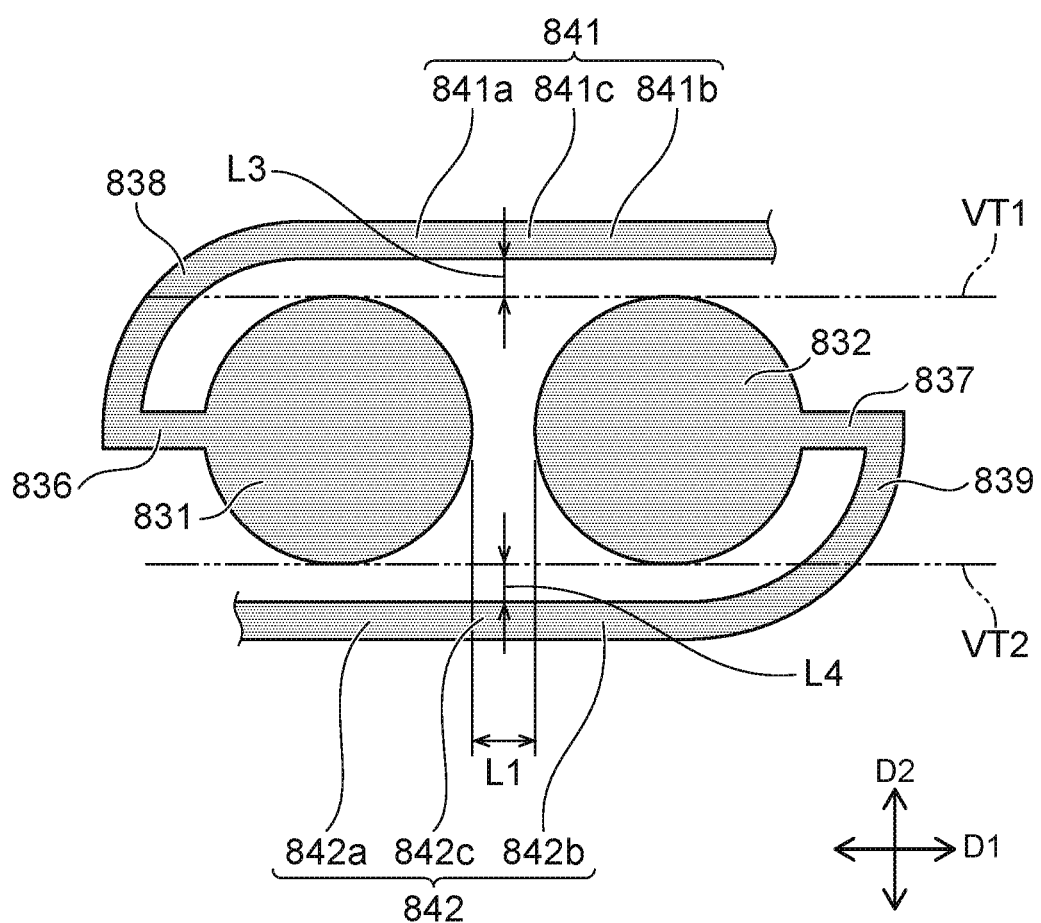
FIG. 11 is a plan view schematically illustrating a portion of a first zone of a heater unit according to a modification of the embodiment.

In the example as illustrated in FIG. 11, the first connection portion 836 extends from the first power feeding portion 831 toward the one side in the first direction. The first connection portion 836 is connected to the first portion 841*a* of the first extension portion 841 via the first curved portion 838 extending along the exterior shape of the first power feeding portion 831. The second connection portion 837 extends from the second power feeding portion 832 toward the other side in the first direction. The second connection portion 837 is connected to the fifth portion 842*b* of the second extension portion 842 via the second curved portion 839 extending along the exterior shape of the second power feeding portion 832.

Figure 12:
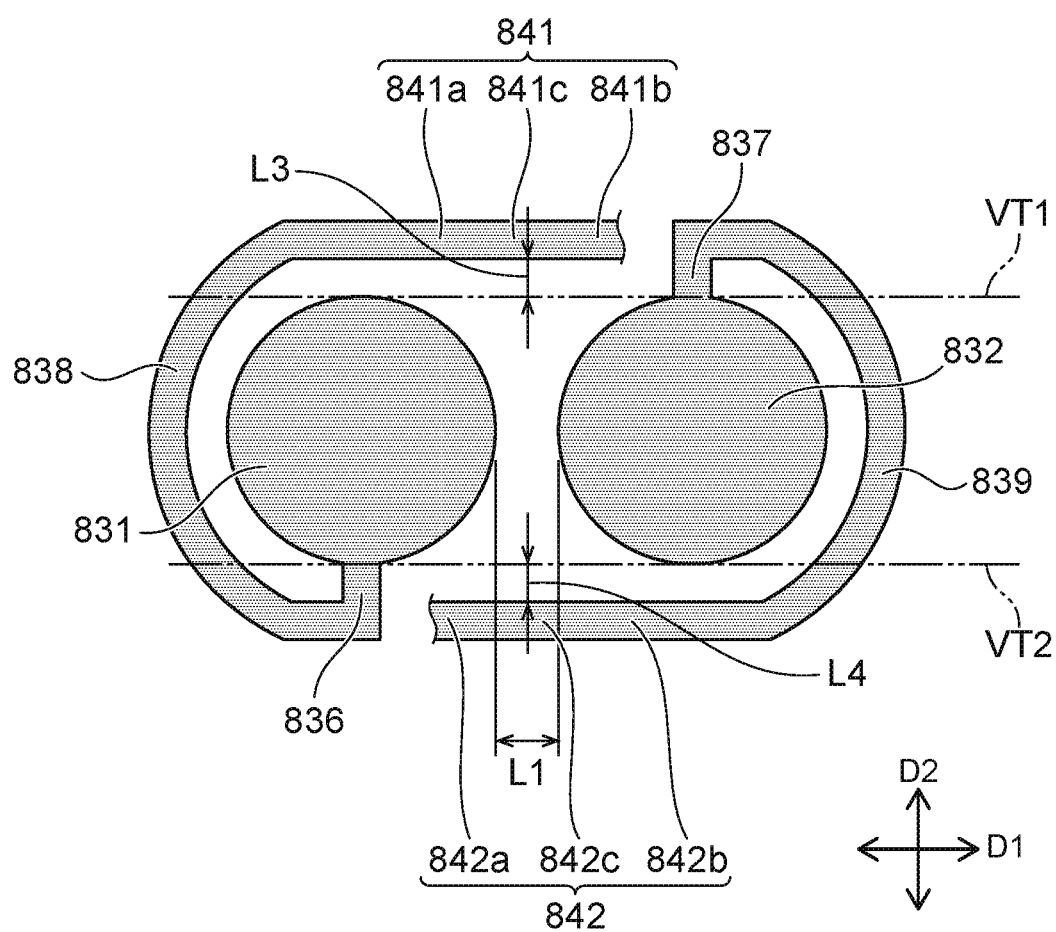
FIG. 12 is a plan view schematically illustrating a portion of a first zone of a heater unit according to a modification of the embodiment.

In the example as illustrated in FIG. 12, the first connection portion 836 extends from the first power feeding portion 831 toward the other side in the second direction. The first connection portion 836 is connected to the first portion 841*a* of the first extension portion 841 via the first curved portion 838 extending along the exterior shape of the first power feeding portion 831. The second connection portion 837 extends from the second power feeding portion 832 toward the one side in the second direction. The second connection portion 837 is connected to the fifth portion 842*b* of the second extension portion 842 via the second curved portion 839 extending along the exterior shape of the second power feeding portion 832.

Figure 13:
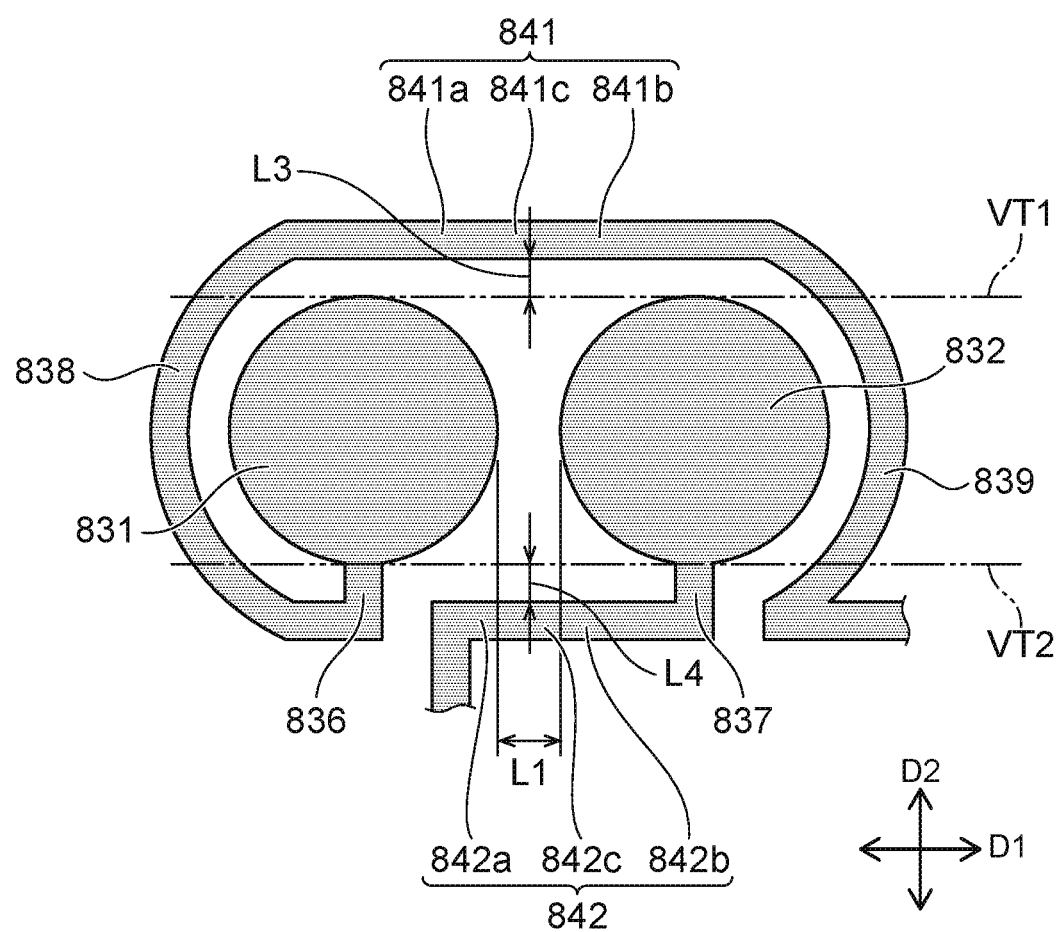
FIG. 13 is a plan view schematically illustrating a portion of a first zone of a heater unit according to a modification of the embodiment.

In the example as illustrated in FIG. 13, the first connection portion 836 extends from the first power feeding portion 831 toward the other side in the second direction. The first connection portion 836 is connected to the first portion 841*a* of the first extension portion 841 via the first curved portion 838 extending along the exterior shape of the first power feeding portion 831. The second portion 841*b* of the first extension portion 841 is connected to the second curved portion 839 extending along the exterior shape of the second power feeding portion 832. The second connection portion 837 extends from the second power feeding portion 832 toward the other side in the second direction. The second connection portion 837 is connected to the fifth portion 842*b* of the second extension portion 842.

Figure 14:
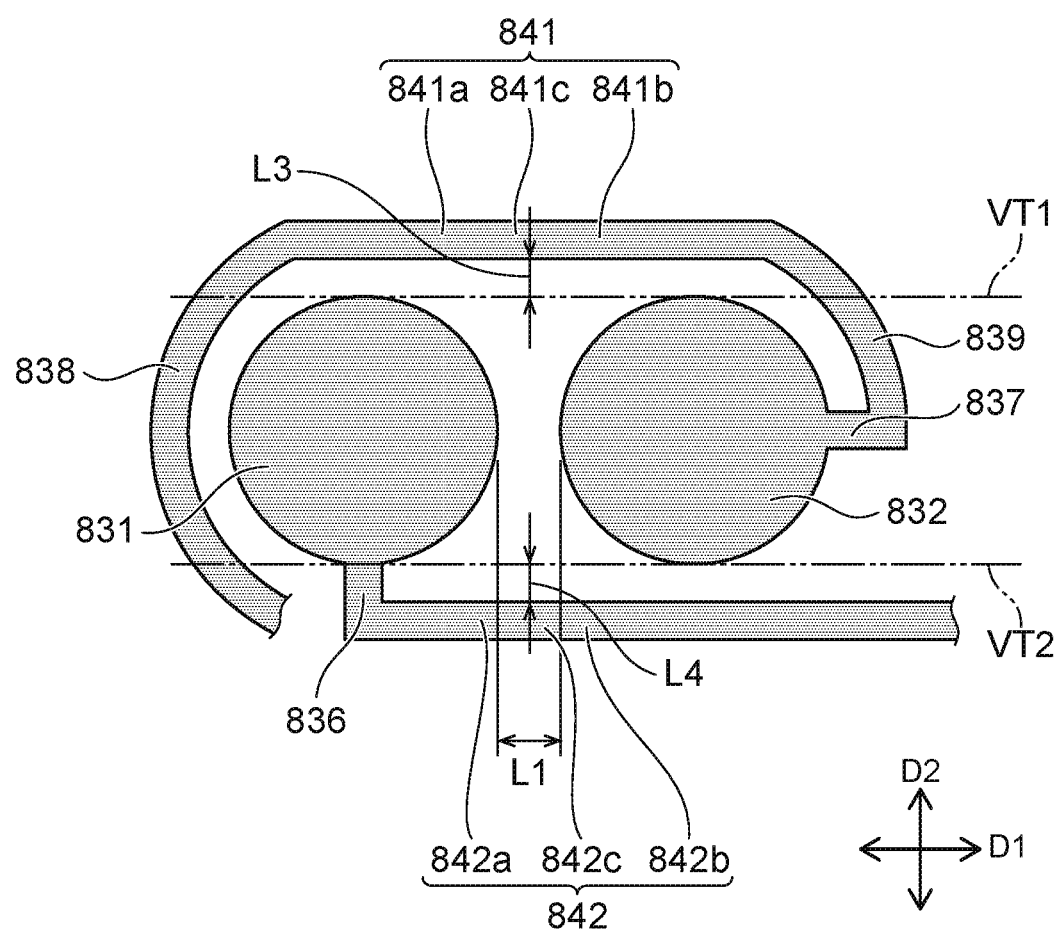
FIG. 14 is a plan view schematically illustrating a portion of a first zone of a heater unit according to a modification of the embodiment.

In the example as illustrated in FIG. 14, the first connection portion 836 extends from the first power feeding portion 831 toward the other side in the second direction. The first connection portion 836 is connected to the fourth portion 842*a* of the second extension portion 842. The second connection portion 837 extends from the second power feeding portion 832 toward the other side in the first direction. The second connection portion 837 is connected to the second portion 841*b* of the first extension portion 841 via the second curved portion 839 extending along the exterior shape of the second power feeding portion 832. The first portion 841*a* of the first extension portion 841 is connected to the first curved portion 838 extending along the exterior shape of the first power feeding portion 831.

In these examples as well, the third distance L3 and the fourth distance L4 each are not more than the first distance L1. The third distance L3 and the fourth distance L4 each are not more than the second distance L2. In these examples as well, the uniformity of the in-plane temperature distribution of the process object W can be increased while suppressing complex temperature control because the first power feeding portion 831 and the second power feeding portion 832 are disposed at positions proximate to each other, and the portions of the heater line 833 (the first extension portion 841 and the second extension portion 842) adjacent to the first and second power feeding portions 831 and 832 are disposed proximate to the first and second power feeding portions 831 and 832.

Figure 15:
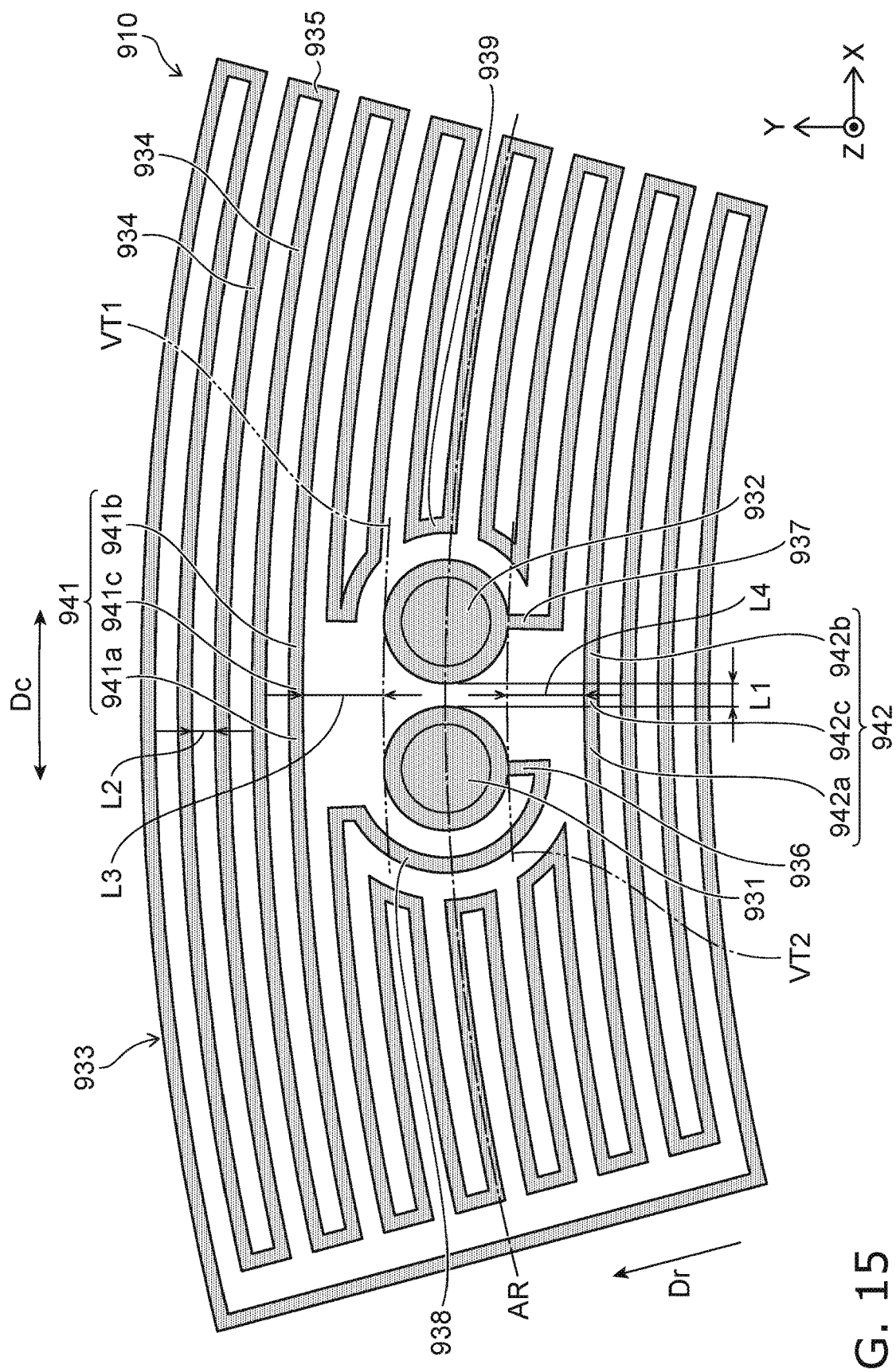
FIG. 15 is a plan view schematically illustrating a first zone of a conventional heater unit.

FIG. 15 is a plan view schematically illustrating a first zone of a conventional heater unit.

As illustrated in FIG. 15, a first zone 910 of the conventional heater unit includes a first power feeding portion 931, a second power feeding portion 932, and a heater line 933. The heater line 933 includes multiple extension portions 934, a folded portion 935, a first connection portion 936, a second connection portion 937, a first curved portion 938, and a second curved portion 939. The multiple extension portions 934 include a first extension portion 941 and a second extension portion 942. The first extension portion 941 includes a first portion 941a, a second portion 941b, and a third portion 941c. The second extension portion 942 includes a fourth portion 942a, a fifth portion 942b, and a sixth portion 942c. The first power feeding portion 931, the second power feeding portion 932, the heater line 933, the extension portion 934, the folded portion 935, the first connection portion 936, the second connection portion 937, the first curved portion 938, the second curved portion 939, the first extension portion 941, the second extension portion 942, the first portion 941a, the second portion 941b, the third portion 941c, the fourth portion 942a, the fifth portion 942b, and the sixth portion 942c correspond respectively to the first power feeding portion 831, the second power feeding portion 832, the heater line 833, the extension portion 834, the folded portion 835, the first connection portion 836, the second connection portion 837, the first curved portion 838, the second curved portion 839, the first extension portion 841, the second extension portion 842, the first portion 841a, the second portion 841b, the third portion 841c, the fourth portion 842a, the fifth portion 842b, and the sixth portion 842c.

The minimum distance in the first direction (the circumferential direction Dc) between the first power feeding portion 931 and the second power feeding portion 932 is taken as the first distance L1. The minimum distance in the second direction (the radial direction Dr) between the multiple extension portions 934 is taken as the second distance L2. The distance in the second direction (the radial direction Dr) between the first virtual tangent VT1 and the first extension portion 941 is taken as the third distance L3. The distance in the second direction (the radial direction Dr) between the second virtual tangent VT2 and the second extension portion 942 is taken as the fourth distance L4.

In the first zone 910 of the conventional heater unit, the third distance L3 and the fourth distance L4 are greater than the first distance L1. In the first zone 910 of the conventional heater unit, the third distance L3 and the fourth distance L4 are greater than the second distance L2.

Figure 16A:
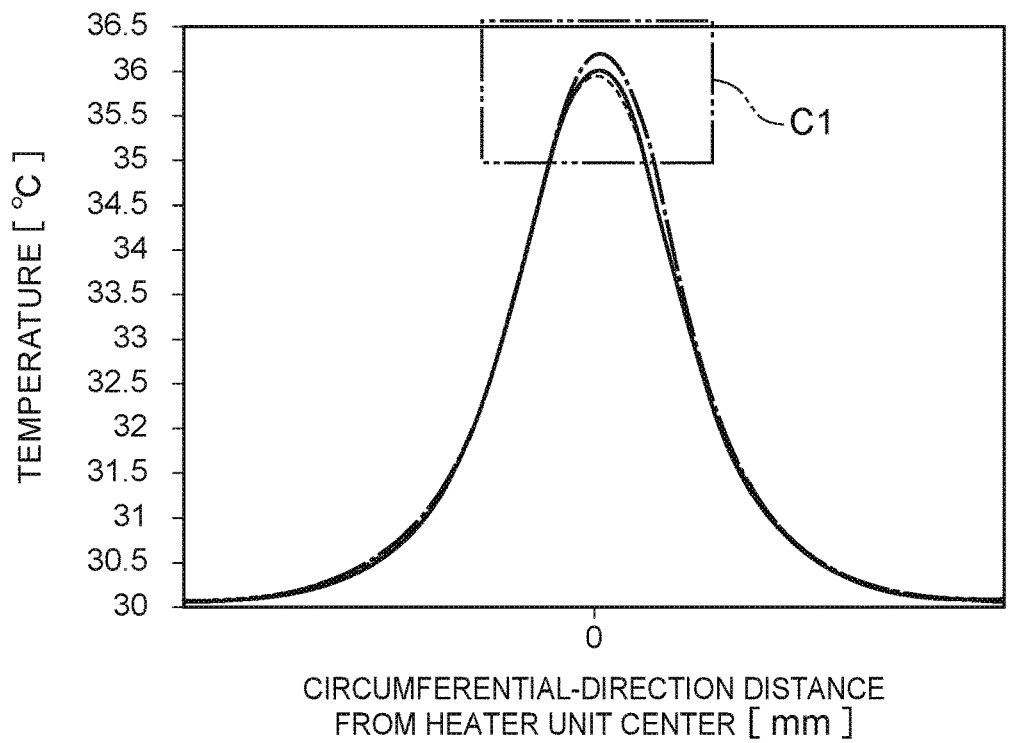
FIGS. 16A and 16B are graphs illustrating simulation results of the temperature distribution of the first zone of the heater unit.
Figure 16B:
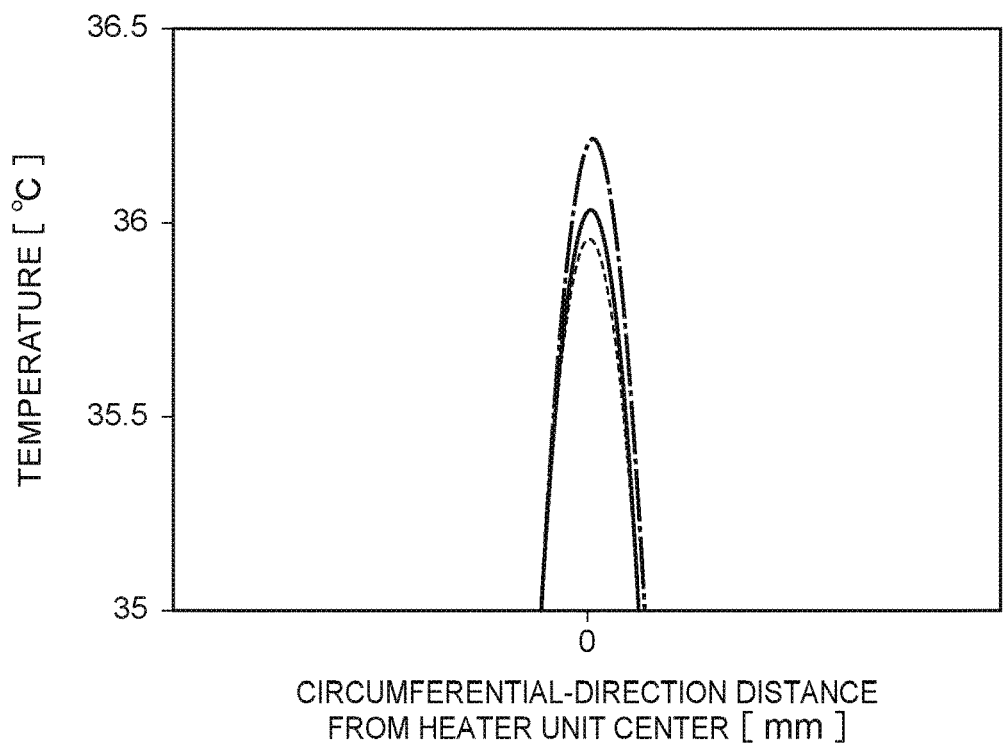

FIGS. 16A and 16B are graphs illustrating simulation results of the temperature distribution of the first zone of the heater unit.

FIG. 16B is an enlarged view of region C1 shown in FIG. 16A.

FIGS. 16A and 16B show simulation results of the temperature distribution on a wafer for samples 1 to 3 when emitting heat by applying a voltage to the heater unit (the first heater element 231) including the first zone in a state in which the coolant temperature is fixed.

In FIGS. 16A and 16B, the horizontal axis is the distance (mm) in the circumferential direction from a midpoint, in which the midpoint of an arc AR connecting the center of the first power feeding portion and the center of the second power feeding portion is taken to be "0"; and the vertical axis is the temperature on the wafer (° C.) at each position. The two end portions of the horizontal axis correspond to the two end portions in the circumferential direction Dc of the first zone.

In FIGS. 16A and 16B, the simulation result of the sample 1 is shown by a solid line, the simulation result of the sample 2 is shown by a single dot-dash line, and the simulation result of the sample 3 is shown by a broken line. The sample 1 corresponds to an electrostatic chuck including the first zone 810 of the heater unit according to the first embodiment shown in FIG. 8. The sample 2 corresponds to an electrostatic chuck including the first zone 810 of the heater unit according to the second embodiment shown in FIG. 9. The sample 3 corresponds to an electrostatic chuck including the first zone 910 of the conventional heater unit shown in FIG. 15.

As illustrated in FIGS. 16A and 16B, the temperature drop around the first and second power feeding portions 831 and 832 is suppressed in the samples 1 and 2 in which the first power feeding portion 831 and the second power feeding portion 832 are disposed at positions proximate to each other and the portions of the heater line 833 (the first extension portion 841 and the second extension portion 842) adjacent to the first and second power feeding portions 831 and 832 are disposed proximate to the first and second power feeding portions 831 and 832 compared to the sample 3 in which the portions of the heater line 933 (the first extension portion 941 and the second extension portion 942) adjacent to the first and second power feeding portions 931 and 932 are not disposed proximate to the first and second power feeding portions 931 and 932.

The third distance L3 of the sample 2 is less than the third distance L3 of the sample 3. Therefore, the temperature drop around the first and second power feeding portions 831 and 832 is more suppressed in the sample 2 than in the sample 1.

Figure 17:
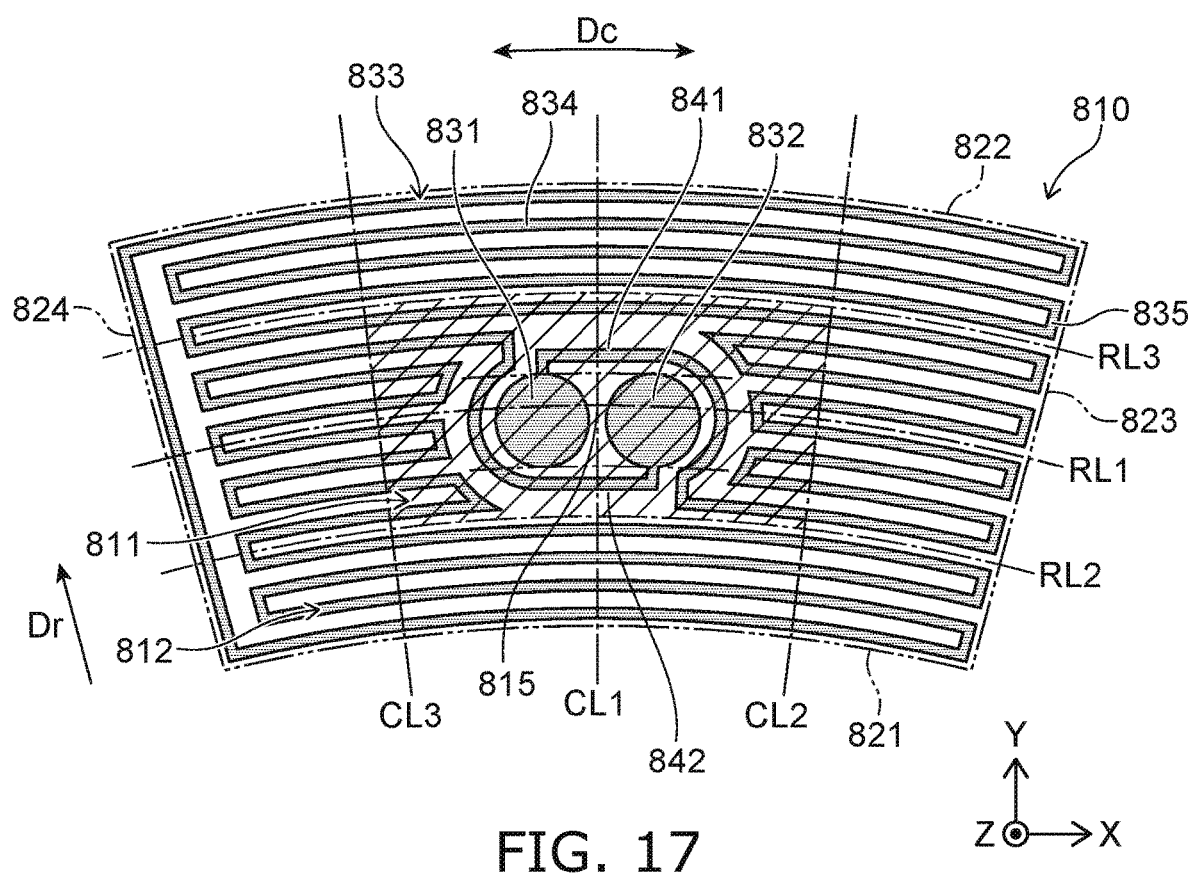
FIG. 17 is a plan view schematically illustrating the first zone of the heater unit according to the embodiment.

FIG. 17 is a plan view schematically illustrating the first zone of the heater unit according to the embodiment.

As illustrated in FIG. 17, the first zone 810 includes a central region 811 and an outer peripheral region 812. The central region 811 is positioned at the center of the first zone 810 when viewed in plan. The outer peripheral region 812 is located outside the central region 811 when viewed in plan. For example, the temperature of the central region 811 is greater than the temperature of the outer peripheral region 812 when the first zone 810 is heated.

In the example, the first zone 810 is a region surrounded with an inner circumference end 821, an outer circumference end 822, a first side end 823, and a second side end 824. The inner circumference end 821 overlaps the inner end portion in the radial direction Dr of the heater line 833 included in the first zone 810. The outer circumference end 822 overlaps the outer end portion in the radial direction Dr of the heater line 833 included in the first zone 810. In the example, the inner circumference end 821 and the outer circumference end 822 have circular arc shapes.

The first side end 823 is positioned between one end of the inner circumference end 821 and one end of the outer circumference end 822. The first side end 823 overlaps the end portion at one side in the circumferential direction Dc of the heater line 833 included in the first zone 810. The second side end 824 is positioned between the other end of the inner circumference end 821 and the other end of the outer circumference end 822. The second side end 824 overlaps the end portion at the other side in the circumferential direction Dc of the heater line 833 included in the first zone 810. In the example, the first side end 823 and the second side end 824 have linear shapes.

The central region 811 includes, for example, a center 815 of the first zone 810. The center 815 is at the intersection between a center line RL1 of the radial direction Dr between the inner circumference end 821 and the outer circumference end 822 and a center line CL1 of the circumferential direction Dc between the first side end 823 and the second side end 824.

The central region 811 is the region between a center line RL2 of the radial direction Dr between the inner circumference end 821 and the center line RL1 and a center line RL3 of the radial direction Dr between the outer circumference end 822 and the center line RL1, and between a center line CL2 of the circumferential direction Dc between the first side end 823 and the center line CL1 and a center line CL3 of the circumferential direction Dc between the second side end 824 and the center line CL1. That is, the central region 811 is the interior of the region surrounded with the center line RL2, the center line RL3, the center line CL2, and the center line CL3.

The outer peripheral region 812 is the region positioned outward of the center line RL2, the center line RL3, the center line CL2, and the center line CL3 (that is, at the side opposite to the center 815). In other words, the outer peripheral region 812 is positioned between the center line RL2 and the inner circumference end 821, between the center line RL3 and the outer circumference end 822, between the center line CL2 and the first side end 823, and between the center line CL3 and the second side end 824.

In the example, the first power feeding portion 831 and the second power feeding portion 832 are located in the central region 811. In the example, the heater line 833 is located in both the central region 811 and the outer peripheral region 812. At least one of the first power feeding portion 831 or the second power feeding portion 832 may be located in the outer peripheral region 812.

In this specification, the first power feeding portion 831 being "located in the central region 811" means that at least a portion of the first power feeding portion 831 overlaps the central region 811 in the Z-direction. That is, the first power feeding portion 831 is considered to be located in the central region 811 even when the first power feeding portion 831 is located on the boundary between the central region 811 and the outer peripheral region 812. In other words, the first power feeding portion 831 is considered to be located in the outer peripheral region 812 when no portion of the first power feeding portion 831 overlaps the central region 811 in the Z-direction. This is similar for the second power feeding portion 832 and the heater line 833 as well.

When the first zone 810 is heated, the temperatures of the first and second power feeding portions 831 and 832 are likely to be less than the temperature of the heater line 833. The outer peripheral region 812 of the first zone 810 is likely to have a lower heat generation density than the central region 811. Therefore, when the first zone 810 is heated, the temperature of the outer peripheral region 812 is likely to be less than the temperature of the central region 811.

In contrast, the uniformity of the in-plane temperature distribution of the first zone 810 can be increased by providing the first power feeding portion 831 and the second power feeding portion 832, which are likely to have lower temperatures than the heater line 833, in the central region 811, which is likely to have a higher temperature than the outer peripheral region 812. The uniformity of the in-plane temperature distribution of the process object W can be increased thereby.

Figure 18:
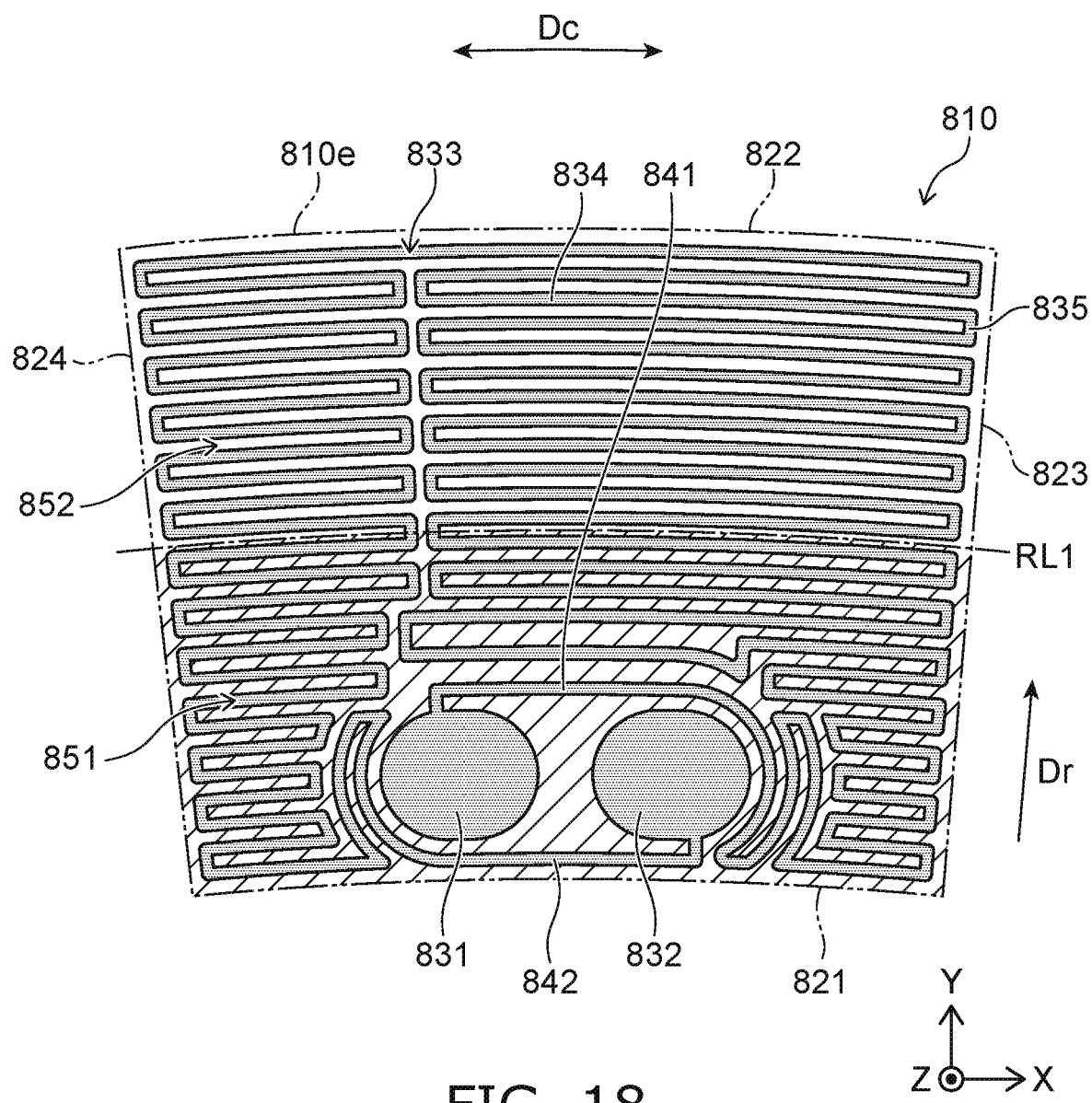
FIG. 18 is a plan view schematically illustrating a first zone of a heater unit according to a modification of the embodiment.

FIG. 18 is a plan view schematically illustrating a first zone of a heater unit according to a modification of the embodiment.

In the example as illustrated in FIG. 18, the first zone 810 includes an outer circumference edge 810*e* of the heater unit 200. That is, in the example, the first zone 810 is positioned at the outermost circumference portion of the heater unit 200. When the first zone 810 is one of the sub-zones 700, the outer circumference edge 810*e* is the outer circumference edge 231*e* of the first heater element 231. When the first zone 810 is one of the main zones 600, the outer circumference edge 810*e* is the outer circumference edge 232*e* of the second heater element 232.

The first zone 810 includes an inner circumference portion 851 and an outer circumference portion 852. The inner circumference portion 851 is a portion positioned inward of the center line RL1 of the radial direction Dr. The outer circumference portion 852 is a portion positioned outward of the center line RL1 of the radial direction Dr. The outer circumference portion 852 includes the outer circumference edge 810*e* of the heater unit 200. The center line RL1 of the radial direction Dr passes through the center in the radial direction Dr between the inner circumference end 821 and the outer circumference end 822 of the first zone 810. That is, the center line RL1 of the radial direction Dr bisects the first zone 810 in the radial direction Dr.

In the example, the first power feeding portion 831 and the second power feeding portion 832 are located in the inner circumference portion 851. In the example, the heater line 833 is located in both the inner circumference portion 851 and the outer circumference portion 852. At least one of the first power feeding portion 831 or the second power feeding portion 832 may be located in the outer circumference portion 852.

In this specification, the first power feeding portion 831 being "located in the inner circumference portion 851" means that at least a portion of the first power feeding portion 831 overlaps the inner circumference portion 851 in the Z-direction. That is, the first power feeding portion 831 is considered to be located in the inner circumference portion 851 even when the first power feeding portion 831 is located on the boundary between the inner circumference portion 851 and the outer circumference portion 852. In other words, the first power feeding portion 831 is considered to be located in the outer circumference portion 852 when no portion of the first power feeding portion 831 overlaps the inner circumference portion 851 in the Z-direction. This is similar for the second power feeding portion 832 and the heater line 833 as well.

The outermost circumference portion of the process object W is likely to have a lower temperature than the inner portion. In contrast, when the first zone 810 includes the outer circumference edge 810*e* of the heater unit 200 (i.e., when the first zone 810 is positioned at the outermost circumference portion of the heater unit 200), the uniformity of the in-plane temperature distribution of the process object W can be increased by providing the first power feeding portion 831 and the second power feeding portion 832, which are likely to have lower temperatures than the heater line 833 when the heater unit 200 is heated, in the inner circumference portion 851 of the first zone 810.

Thus, according to embodiments, an electrostatic chuck is provided in which the uniformity of the in-plane temperature distribution of the process object can be increased while suppressing complex temperature control.

The invention has been described with reference to the embodiments. However, the invention is not limited to these embodiments. Any design changes in the above embodiments suitably made by those skilled in the art are also encompassed within the scope of the invention as long as they fall within the spirit of the invention. For example, the shape, the size the material, the disposition and the arrangement or the like of the components included in the electrostatic chuck are not limited to illustrations and can be changed appropriately.

The components included in the embodiments described above can be combined to the extent possible, and these combinations are also encompassed within the scope of the invention as long as they include the features of the invention.

What is claimed is:

1. An electrostatic chuck, comprising:
a ceramic dielectric substrate having a first major surface configured to have a process object placed thereon and a second major surface opposite to the first major surface;
a base plate supporting the ceramic dielectric substrate; and
a heater unit which heats the ceramic dielectric substrate,
the heater unit including
a first power feeding portion,
a second power feeding portion adjacent to the first power feeding portion, and
a heater line emitting heat by allowing a current to flow, the heater line being one electrode connecting the first and second power feeding portions,
the heater line including a plurality of extension portions arranged in a second direction perpendicular to a first direction, the plurality of extension portions extending along the first direction,
the plurality of extension portions including
a first extension portion adjacent to the first and second power feeding portions at one side in the second direction, and
a second extension portion adjacent to the first and second power feeding portions at an other side in the second direction,
the first extension portion including
a first portion overlapping the first power feeding portion in the second direction,
a second portion overlapping the second power feeding portion in the second direction, and
a third portion positioned between the first portion and the second portion in the first direction, the third portion not overlapping the first and second power feeding portions in the second direction,
the second extension portion including
a fourth portion overlapping the first power feeding portion in the second direction,
a fifth portion overlapping the second power feeding portion in the second direction, and
a sixth portion positioned between the fourth portion and the fifth portion in the first direction, the sixth portion not overlapping the first and second power feeding portions in the second direction,
a first distance being a minimum distance in the first direction between the first power feeding portion and the second power feeding portion,
a second distance being a minimum distance in the second direction between the plurality of extension portions,
a third distance being a distance in the second direction between the first extension portion and a first virtual tangent,
the first virtual tangent contacting the first and second power feeding portions along the first direction at the one side in the second direction,
a fourth distance being a distance in the second direction between the second extension portion and a second virtual tangent,
the second virtual tangent contacting the first and second power feeding portions along the first direction at the other side in the second direction,
the third distance and the fourth distance each being not more than the first distance,
the third distance and the fourth distance each being not more than the second distance.

2. The chuck according to claim 1, wherein
the heater unit includes a plurality of zones,
the plurality of zones includes a first zone,
the first zone includes the first power feeding portion, the second power feeding portion, and the heater line,
the first zone includes
a central region positioned at a center of the first zone when viewed along a Z-direction perpendicular to the first major surface, and
an outer peripheral region positioned outside the central region when viewed along the Z-direction, and
the first power feeding portion and the second power feeding portion are located in the central region.

3. The chuck according to claim 1, wherein
the heater unit includes a plurality of zones,
the plurality of zones includes a first zone,
the first zone includes the first power feeding portion, the second power feeding portion, and the heater line,
the first zone includes an outer circumference edge of the heater unit,
the first zone includes:
an inner circumference portion positioned radially inward of a center line of the radial direction, the center line of the radial direction bisecting the first zone in the radial direction; and
an outer circumference portion positioned radially outward of the center line of the radial direction, the outer circumference portion including the outer circumference edge, and
the first power feeding portion and the second power feeding portion are located in the inner circumference portion.

4. The chuck according to claim 1, wherein
the first direction is a circumferential direction.

5. The chuck according to claim 1, wherein
the first direction is a radial direction.

* * * * *